(12) United States Patent
Lee et al.

(10) Patent No.: US 9,239,778 B2
(45) Date of Patent: Jan. 19, 2016

(54) CONTROLLERS THAT GENERATE OUTPUT BITS FOR STORAGE IN NON-VOLATILE MEMORY DEVICES BY PUNCTURING CODE WORD BITS AND METHODS FOR OPERATING THE SAME

(71) Applicant: Samsung Electronics Co., Ltd., Suwon-Si, Gyeonggi-Do (KR)

(72) Inventors: Kijun Lee, Seoul (KR); Junjin Kong, Yongin-si (KR); Dong-Min Shin, Pohang-si (KR); Kyeongcheol Yang, Pohang-si (KR); Seung-Chan Lim, Pohang-si (KR)

(73) Assignees: SAMSUNG ELECTRONICS CO., LTD., Gyeonggi-Do (KR); POSTECH ACADEMY-INDUSTRY FOUNDATION, Gyeongsangbuk-Do (KR)

( * ) Notice: Subject to any disclaimer, the term of this patent is extended or adjusted under 35 U.S.C. 154(b) by 111 days.

(21) Appl. No.: 14/054,964

(22) Filed: Oct. 16, 2013

(65) Prior Publication Data

US 2014/0108748 A1    Apr. 17, 2014

(30) Foreign Application Priority Data

Oct. 17, 2012    (KR) .................... 10-2012-0115557

(51) Int. Cl.
*G06F 3/00*    (2006.01)
*G06F 13/00*    (2006.01)
(Continued)

(52) U.S. Cl.
CPC ........... *G06F 12/00* (2013.01); *H03M 13/1111* (2013.01); *H03M 13/1191* (2013.01); *H03M 13/13* (2013.01); *H03M 13/6362* (2013.01)

(58) Field of Classification Search
CPC .............. G06F 12/00; H03M 13/1111; H03M 13/1191; H03M 13/13; H03M 13/6362
See application file for complete search history.

(56) References Cited

U.S. PATENT DOCUMENTS 7,827,472 B2     11/2010   Crozier et al.
8,347,186 B1 *   1/2013    Arikan ......................... 714/774
(Continued)

FOREIGN PATENT DOCUMENTS

| CN | 102164025 A  * | 8/2011 |
| KR | 20110060635 A  | 6/2011 |
| WO | WO 2014/044072 A1 * | 9/2012 |

OTHER PUBLICATIONS

"Beyond Turbo Codes: Rate-Compatible Punctured Polar Codes" by Kai Niu, Kai Chen and Jia-Ru Lin, IEEE 2013.*

(Continued)

*Primary Examiner* — Henry Tsai
*Assistant Examiner* — Jing-Yih Shyu
(74) *Attorney, Agent, or Firm* — Harness, Dickey & Pierce, P.L.C.

(57) ABSTRACT

An operating method of a controller includes selecting bits of code word to be punctured; detecting locations of incapable bits of an input word based on locations of the bits to be punctured and a structure of a generation matrix calculation unit; refreezing the input word such that frozen bits and incapable bits of the input word overlap; generating input word bits by replacing information word bits with frozen bits based on the refreezing result; generating the code word by performing generation matrix calculation on the input word bits; generating output bits by puncturing the code word based on locations of the bits to be punctured; and transmitting the output bits to a nonvolatile memory device.

22 Claims, 24 Drawing Sheets

(51) Int. Cl.
*G06F 12/00* (2006.01)
*H03M 13/11* (2006.01)
*H03M 13/13* (2006.01)
*H03M 13/00* (2006.01)

(56) References Cited

U.S. PATENT DOCUMENTS

| | | |
|---|---|---|
| 2007/0288834 A1 | 12/2007 | Crozier et al. |
| 2009/0070652 A1 | 3/2009 | Myung et al. |
| 2009/0204869 A1 | 8/2009 | Myung et al. |
| 2009/0217130 A1 | 8/2009 | Myung et al. |
| 2010/0070820 A1 | 3/2010 | Sakai et al. |
| 2010/0325511 A1 | 12/2010 | Oh et al. |
| 2011/0197105 A1 | 8/2011 | Murakami et al. |
| 2013/0283128 A1 | 10/2013 | Lee et al. |

OTHER PUBLICATIONS

"A Non-Asymptotic Approach to the Analysis of Communication Networks—From Error Correcting Codes to Network Properties" by Ali Eslami, Dissertations at University of Massachusetts- Amherst, May 1, 2013.*

"Efficient Design and Decoding of Polar Codes" by Peter Trifonov, IEEE Transactions on Communications, vol. 60, No. 11, Nov. 2012.*

"Polar Codes—A New Paradigm for Coding" by R. Urbanke, EPFL, Physics of Algorithms, Santa Fe, Sep. 2, 2009.*

Eslami, A., et al. "A Practical Approach to Polar Codes", IEEE International Symposium on Information Theory Proceedings, pp. 16-20, (2011).

Arikan, Erdal, "Channel Polarization: A Method for Constructing Capacity-Achieving Codes for Symmetric Binary-Input Memoryloss Channels", IEEE Transactions on Information Theory, vol. 55, No. 7, pp. 3051-3073, (2009).

Shin, Dong-Min, et al. "Design of Length-Compatible Polar Codes Based on the Reduction of Polarizing Matrices", IEEE Transactions on Communications, vol. 61, No. 7, pp. 2593-2599, (2013).

* cited by examiner

CONTROLLERS THAT GENERATE OUTPUT BITS FOR STORAGE IN NON-VOLATILE MEMORY DEVICES BY PUNCTURING CODE WORD BITS AND METHODS FOR OPERATING THE SAME

CROSS-REFERENCE TO RELATED APPLICATIONS

This application claims priority under 35 U.S.C. §119 to Korean Patent Application No. 10-2012-0115557 filed Oct. 17, 2012, in the Korean Intellectual Property Office, the entire contents of which are hereby incorporated by reference.

BACKGROUND

1. Field

Example embodiments of inventive concepts described herein relate to semiconductor devices, for example, controllers to control nonvolatile memory devices and operating methods of controllers.

2. Description of Conventional Art

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

Errors may be generated at data writing and reading operations. A variety of error correction codes may be applied to a memory controller to detect and correct errors. The error correction codes may include an RS (Reed-Solomon) code, a BCH (Bose-Chaudhuri-Hocquenghem) code, an LDPC (Low Density Parity Check) code, and so on.

In recent years, research on polarization codes using channel calculation and split may have been made.

SUMMARY

At least one example embodiment of inventive concepts is directed to an operating method of a controller, which is configured to control a nonvolatile memory device. The operating method includes: selecting bits of a polar encoded code word to be punctured; detecting locations of incapable bits, lost by the puncturing, of an input word of the polar code encoding, based on locations of the bits to be punctured and a structure of a generation matrix associated with the polar code encoding; refreezing the input word such that frozen bits and incapable bits of the input word overlap; generating input word bits by replacing information word bits with frozen bits based on the refreezing result; generating the code word bits by performing generation matrix calculation about the input word bits; generating output bits by puncturing the code word bits based on locations of the bits to be punctured; and transmitting the output bits to the nonvolatile memory device.

At least one other example embodiment of inventive concepts is directed to a method of operating a controller for a nonvolatile memory device, the method including: selecting bits of a polar encoded code word to be punctured; determining an error probability associated with bits of an input word based on the selected bits of the polar encoded code word; identifying bits of the input word to be replaced with static bit values based on the determined error probability; generating a modified input word by replacing the identified bits of the input word with the static bit values; generating the polar encoded code word based on the modified input word; puncturing the polar encoded code word to generate an output code word; and transmitting the output code word to the nonvolatile memory device.

In at least some example embodiments, locations of the frozen bits when the bits to be punctured are selected are different from locations of the frozen bits when the bits to be punctured are not selected.

In at least some example embodiments, locations of the incapable bits vary when locations of the bits to be punctured vary.

In at least some example embodiments, the selecting bits to be punctured includes: calculating polarization exponents of the generation matrix calculation unit while varying locations of the bits to be punctured; and selecting locations of the bits of the polar encoded code word having a higher polarization exponent.

In at least some example embodiments, the selecting bits to be punctuated includes: dividing the generation matrix into a plurality of portions; calculating a polarization exponent of at least one portion of the generation matrix while varying a location of at least one bit to be punctured; and selecting a location of the at least one bit to be punctured having a higher polarization exponent at the at least one portion of the generation matrix.

In at least some example embodiments, the generation matrix is divided into at least two stages in a direction from an input to an output, each of the at least two stages is divided into a plurality of square matrixes, and the at least one portion of the generation matrix corresponds to at least one square matrix of a stage adjacent to the output.

In at least some example embodiments, locations of the remaining portions of the generation matrix corresponding to a location of the at least one bit to be punctured are selected as locations of the bits to be punctured.

In at least some example embodiments, the bits to be punctured are periodically distributed at the code word bits, and the incapable bits are localized in terms of blocks at the input word bits.

In at least some example embodiments, the refreezing the input word includes: selecting the incapable bits as the frozen bits; and if remaining frozen bits exist after selecting of the incapable bits, calculating density evolution of the code word bits and selecting locations of the remaining frozen bits to have a higher reliability according to the calculated density evolution.

At least one other example embodiment of inventive concepts is directed to a controller including: a puncturing bit register configured to store information associated with bits of a polar encoded code word to be punctured; a location providing unit configured to provide locations of the bits to be punctured and frozen bits based on the information associated with the bits to be punctured stored at the puncturing bit register; a frozen bit inserting unit configured to receive information word bits and to generate input word bits by inserting the frozen bits into the information word bits based on the locations of the frozen bits from the location providing unit;

a generation matrix calculating unit configured to generate code word bits by calculating a generation matrix with the input word bits; and a puncturing unit configured to generate output bits by puncturing the code word bits based on the locations of the bits to be punctured provided from the location providing unit.

At least one other example embodiment of inventive concepts is directed to a controller including: a puncturing bit register configured to store information regarding bits of a polar encoded code word to be punctured; a location providing circuit configured to identify bits of an input word to be replaced with static bit values based on an error probability associated with bits of the input word, the error probability being based on the stored information; a frozen bit inserting circuit configured to generate a modified input word by replacing the identified bits of the input word with the static bit values; a generation matrix calculation circuit configured to generate the polar encoded code word based on the modified input word; a puncturing circuit configured to puncture the polar encoded code word to generate an output code word; and transmitting the output code word to a nonvolatile memory device.

In at least some example embodiments, the output bits may be transmitted to a nonvolatile memory controlled by the controller.

In at least some example embodiments, the location providing unit may be further configured to calculate the locations of the bits to be punctured and the frozen bits based on the information of the bits to be punctured and a structure of the generation matrix and/or of the generation matrix calculation unit.

In at least some example embodiments, the location providing unit is further configured to store a location table and to detect locations of the bits to be punctured and the frozen bits based on the information of the bits to be punctured and the location table.

In at least some example embodiments, the controller may further include: a decoding unit configured to receive data from a nonvolatile memory controlled by the controller and to perform successive cancellation decoding, message passing decoding, or list decoding on the received data.

In at least some example embodiments, the controller forms a memory card or a solid state drive with a nonvolatile memory.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
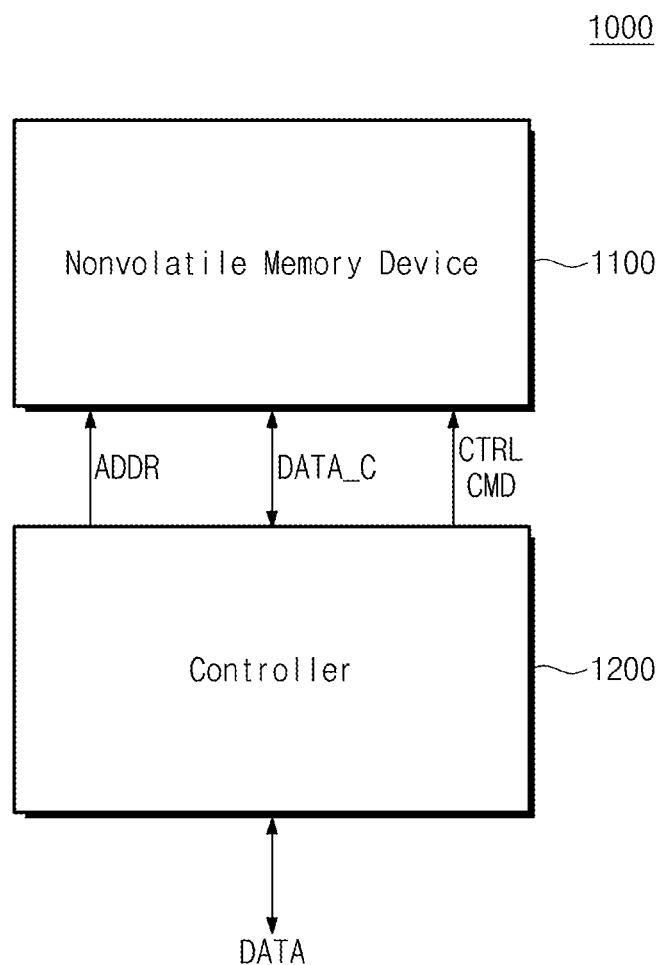
FIG. 1 is a block diagram schematically illustrating a memory system according to an example embodiment of inventive concepts.

Example embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an example embodiment of inventive concepts. Referring to FIG. 1, a memory system 1000 may include a nonvolatile memory device 1100 and a controller 1200.

The nonvolatile memory device 1100 may be configured to perform write, read, and erase operations according to a control of the controller 1200.

The controller 1200 may be connected to a host and the nonvolatile memory device 1100. The controller 1200 may access the nonvolatile memory device 1100 in response to a request from the host. For example, the controller 1200 may be configured to control write, read, and erase operations of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 may receive data from the host. The controller 1200 may encode the input data to generate coded data DATA_C. The controller 1200 may be configured to provide a control signal CTRL and an address ADDR to the nonvolatile memory device 1100. The controller 1200 may be configured to exchange the coded data DATA_C with the nonvolatile memory device 1100. The controller 1200 may receive the coded data DATA_C from the nonvolatile memory device 1100 to decode the coded data DATA_C. The controller 1200 may transfer the decoded data to the host.

Figure 2:
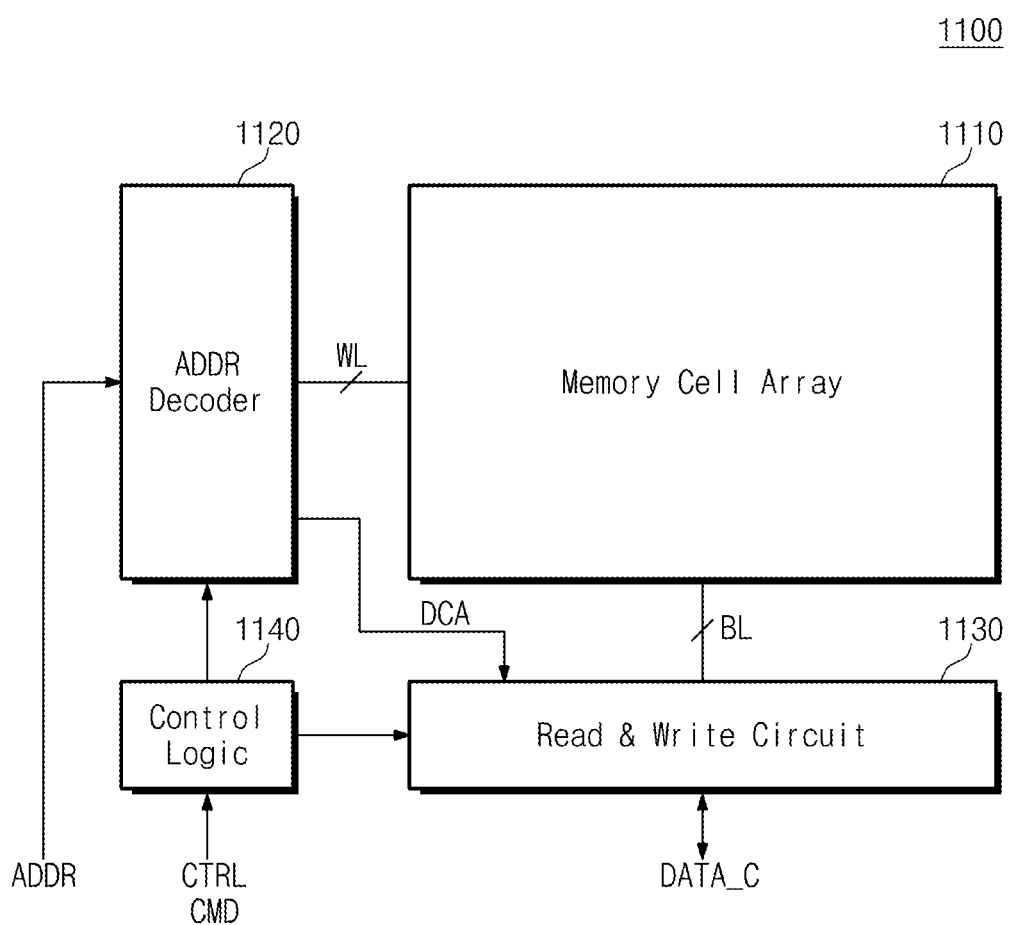
FIG. 2 is a block diagram schematically illustrating a nonvolatile memory device according to an example embodiment of inventive concepts.

FIG. 2 is a block diagram schematically illustrating a nonvolatile memory device according to an example embodiment of inventive concepts. Referring to FIG. 2, a nonvolatile memory device 1100 may include a memory cell array 1110, an address decoder 1120, a read/write circuit 1130, and control logic 1140.

The memory cell array 1110 may be connected to the address decoder 1120 via word lines WL and to the read/write circuit 1130 via bit lines BL. The memory cell array 1110 may include a plurality of memory cells. Memory cells arranged in a row direction may be connected with word lines, and memory cells arranged in a column direction may be connected with bit lines. For example, memory cells arranged in a column direction may form a plurality of cell groups (e.g., strings). The plurality of cell groups may be connected to bit lines, respectively. In example embodiments, each of memory cells may store one or more bits of data.

The address decoder 1120 may be connected to the memory cell array 1110 through the word lines WL. The address decoder 1120 may operate responsive to a control of the control logic 1140. The address decoder 1120 may receive an address ADDR from an external device.

The address decoder 1120 may be configured to decode a row address of the input address ADDR. The address decoder 1120 may select the word lines WL using the decoded row address. The address decoder 1120 may be configured to decode a column address of the input address ADDR. The decoded column address DCA may be transferred to the read/write circuit 1130. For example, the address decoder 1120 may include components such as a row decoder, a column decoder, an address buffer, and so on.

The read/write circuit 1130 may be connected to the memory cell array 1110 through the bit lines BL, and may exchange coded data DATA_C with the external device. The read/write circuit 1130 may operate responsive to a control of the control logic 1140. The read/write circuit 1130 may select the bit lines BL in response to the decoded column address DCA.

The read/write circuit 1130 may receive the coded data DATA_C from the external device to write it at the memory cell array 1110. The read/write circuit 1130 may read coded data DATA_C from the memory cell array 1110 to transfer it to the external device. The read/write circuit 1130 may read data from a first storage region of the memory cell array 1110 to write it at a second storage region of the memory cell array 1110. For example, the read/write circuit 1130 may be configured to perform a copy-back operation.

In example embodiments, the read/write circuit 1130 may include constituent elements such as a page buffer (or, a page register), a column selecting circuit, a data buffer, and so on. In other example embodiment, the read/write circuit 1130 may include constituent elements such as a sense amplifier, a write driver, a column selecting circuit, a data buffer, and the like.

The control logic 1140 may be connected to the address decoder 1120 and the read/write circuit 1130. The control logic 1140 may be configured to control an overall operation of the nonvolatile memory device 1100.

Figure 3:
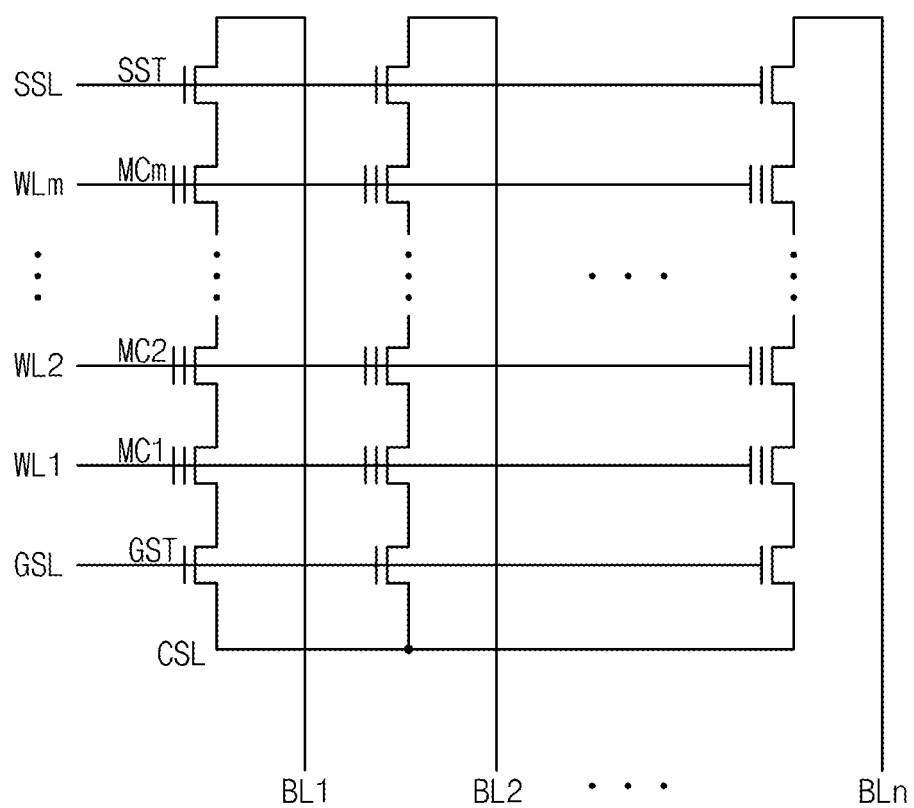
FIG. 3 is a circuit diagram schematically illustrating a memory cell array according to an example embodiment of inventive concepts.

FIG. 3 is a circuit diagram schematically illustrating a memory cell array according to an example embodiment of inventive concepts. Referring to FIG. 3, memory cells MC1 to MCm provided along a row direction may be connected with word lines WL1 to WLm. Memory cells in the same row may be connected with the same word line WL.

Memory cells MC1 to MCm provided along a column direction may correspond to bit lines BL1 to BLn, respectively. Memory cells MC1 to MCm in the same column may correspond to the same bit line BL.

String selection transistors SST may be connected between the bit lines BL1 to BLn and the memory cells MC1 to MCm. The string selection transistors SST may be connected with a string selection line SSL. Ground selection transistors GST may be connected between the memory cells MC1 to MCm and a common source line CSL. The ground selection transistors GST may be connected with a ground selection line GSL.

A memory cell array 1110*a* may be a planar NAND flash memory array.

Figure 4:
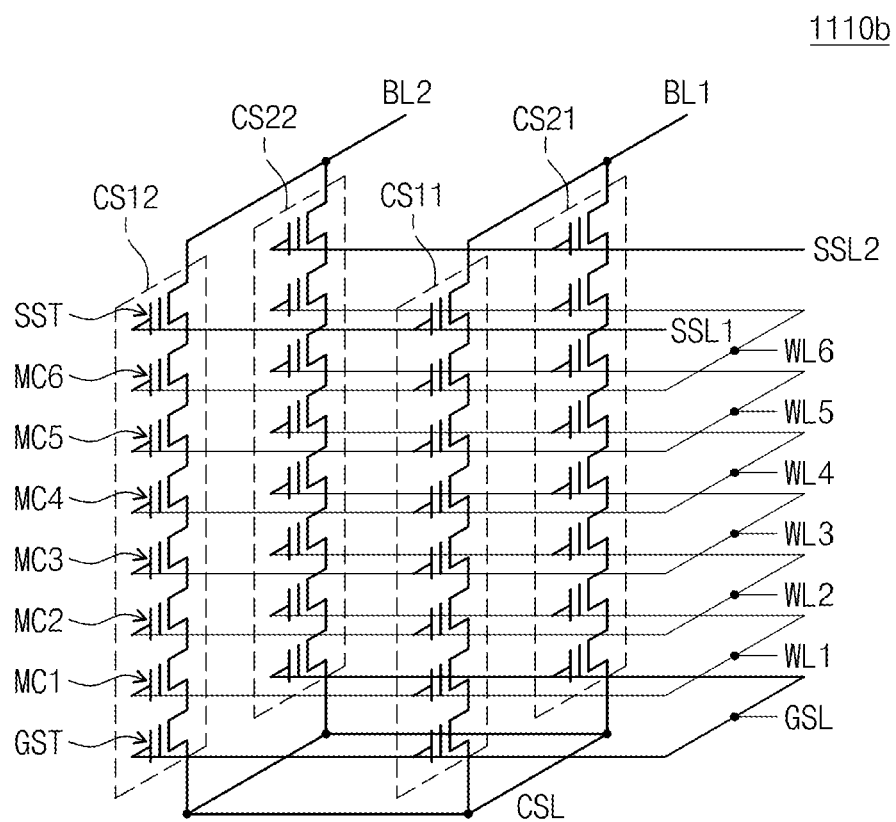
FIG. 4 is a circuit diagram schematically illustrating a memory cell array according to another example embodiment of inventive concepts.

FIG. 4 is a circuit diagram schematically illustrating a memory cell array according to another example embodiment of inventive concepts. Referring to FIG. 4, cell strings CS11, CS12, CS21, and CS22 may be provided between bit lines BL1 and BL2 and a common source line CSL. The cell strings CS11 and CS21 may be connected between the first bit line BL1 and the common source line CSL. The cell strings CS12 and CS22 may be connected between the second bit line BL2 and the common source line CSL.

Memory cells at the same height may be connected in common with a word line (or, a dummy word line). Thus, when a voltage is applied to a word line (or, a dummy word line) at a specific word line, it may be applied to all cell strings CS11, CS12, CS21, and CS22.

Cell strings at different rows may be connected to different string selection lines SSL1 and SSL2, respectively. The cell strings CS11, CS12, CS21, and CS22 may be selected or unselected by a row unit by selecting or unselecting the first and second string selection lines SSL1 and SSL2. For example, cell strings cell strings CS11 and CS12 or CS21 and CS22 connected with an unselected string selection line SSL1 or SSL2 may be electrically isolated from the bit lines BL1 and BL2. Cell strings cell strings CS21 and CS22 or CS11 and CS12 connected with a selected string selection line SSL2 or SSL1 may be electrically connected with the bit lines BL1 and BL2.

The cell strings CS11, CS12, CS21, and CS22 may be connected with the bit lines BL1 and BL2 by a column unit. The cell strings CS11 and CS21 may be connected with the first bit line BL1, and the cell strings CS12 and CS22 may be connected with the second bit line BL2. The cell strings CS11, CS12, CS21, and CS22 may be selected or unselected by a column unit by selecting or unselecting the bit lines BL1 and BL2.

A memory cell array 1110*b* may be a vertical NAND flash memory array.

As described with reference to FIGS. 3 and 4, a nonvolatile memory device 1100 may include a NAND flash memory device. However, inventive concepts are not limited thereto. The nonvolatile memory device 1100 may include a variety of nonvolatile memory devices necessitating error correction. For example, the nonvolatile memory device 1100 may include a phase-change RAM (PRAM), a magnetic RAM (MRAM), a resistive RAM (RRAM), a ferroelectric RAM (FRAM), and so on.

Figure 5:
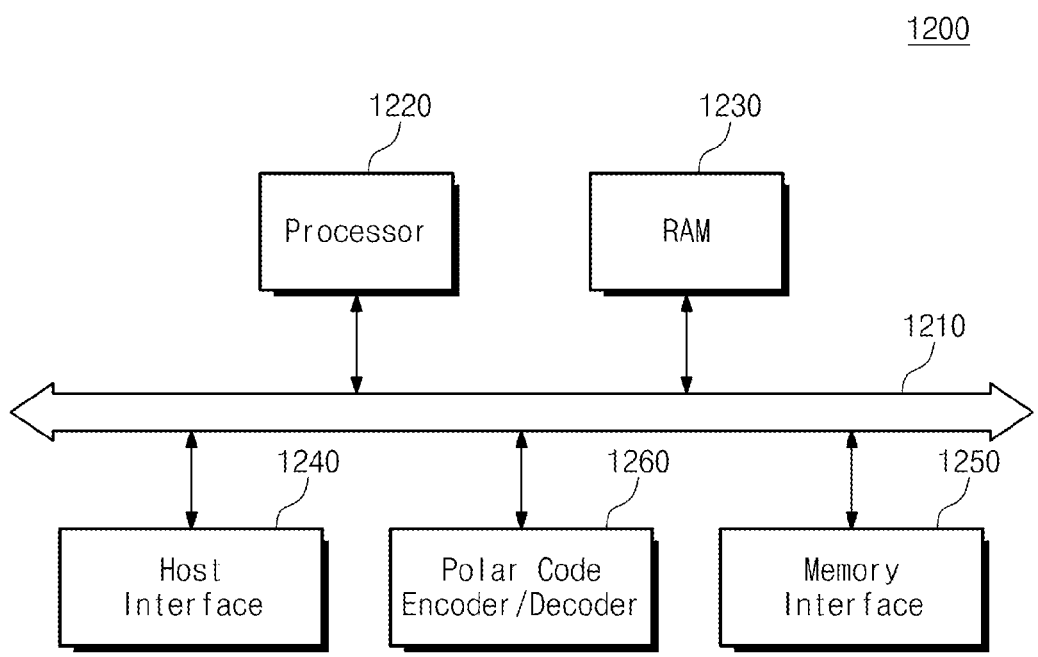
FIG. 5 is a block diagram schematically illustrating a controller according to an example embodiment of inventive concepts.

FIG. 5 is a block diagram schematically illustrating a controller according to an example embodiment of inventive concepts. Referring to FIG. 5, a controller 1200 may include a system bus 1210, a processor 1220, a RAM 1230, a host interface 1240, a memory interface 1250, and a polar code encoder/decoder 1260.

The system bus 1210 may provide a channel among the components 1220 to 1260 of the controller 1200.

The processor 1220 may control an overall operation of the controller 1200.

The RAM 1230 may be used as at least one of a working memory, a cache memory, and a buffer memory.

The host interface 1240 may communicate with an external device (e.g., the host) via at least one of various communications standards such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), and a Firewire.

The memory interface 1250 may interface with a nonvolatile memory device 1100 (refer to FIG. 1). The memory interface 1250 may include a NAND interface or a NOR interface.

The polar code encoder/decoder 1260 may perform polar code encoding on data received from an external host and polar code decoding on data received from the nonvolatile memory device 1100.

Figure 6:
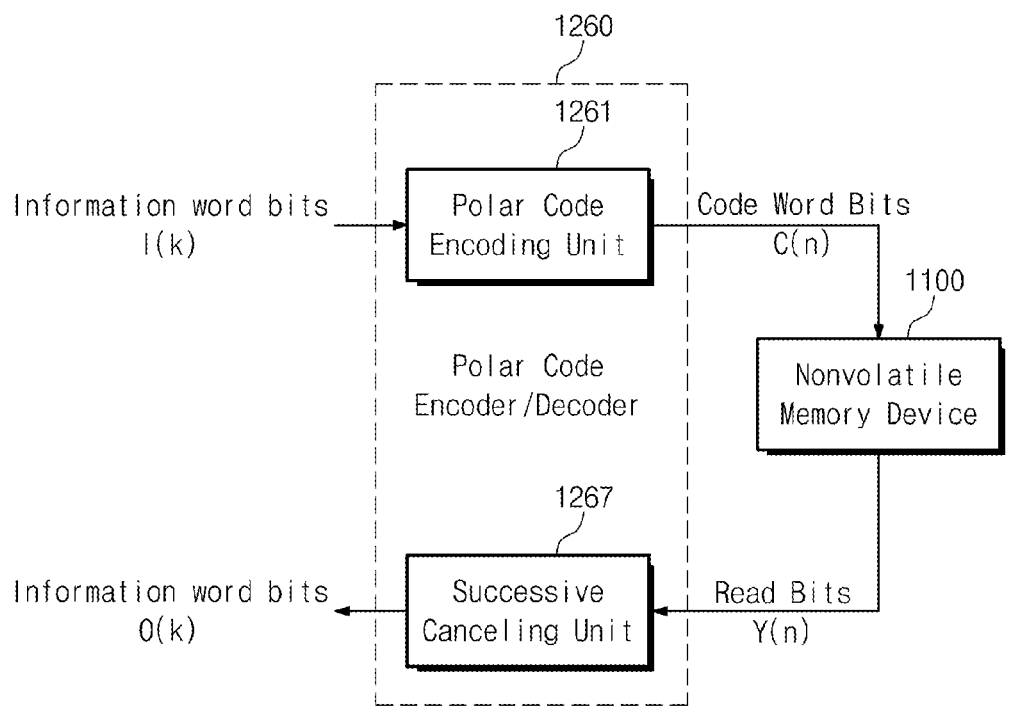
FIG. 6 is a block diagram schematically illustrating a polar code encoder/decoder according to an example embodiment of inventive concepts.

FIG. 6 is a block diagram schematically illustrating a polar code encoder/decoder according to an example embodiment of inventive concepts. Referring to FIGS. 5 and 6, a polar code encoder/decoder 1260 may include a polar code encoding unit 1261 and a successive canceling unit 1267.

The polar code encoding unit 1261 may receive k information word bits I(k) (k being a positive integer). The information word bits I(k) may be received from a host.

The polar code encoding unit 1261 may perform polar code encoding on the information word bits I(k) to generate n code word bits C(n) (n being an integer larger than k).

The code word bits C(n) may be programmed at a nonvolatile memory device 1100. Data programmed at the nonvolatile memory device 1100 may be read as n read bits Y(n).

The successive canceling unit 1267 may perform successive cancellation decoding on the read bits Y(n) to generate k information word bits O(k).

The nonvolatile memory device 1100 may be understood to be a channel where code word bits C(n) encoded by the polar code encoding unit 1261 are transferred.

In example embodiments, the polar code encoder/decoder 1260 may include the successive canceling unit 1267. However, inventive concepts are not limited thereto. The successive canceling unit 1267 may be replaced with a function block which performs decoding using one of various decoding algorithms such as message passing decoding, list decoding, and so on.

Figure 7:
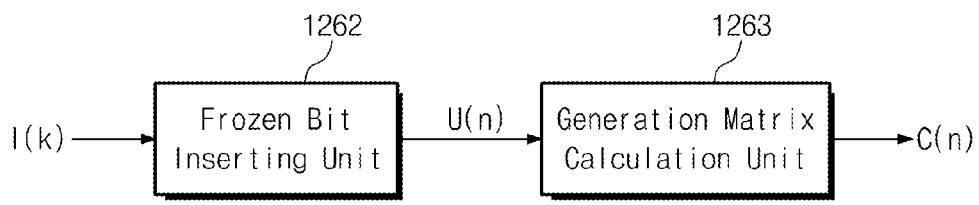
FIG. 7 is a block diagram schematically illustrating a polar code encoding unit according to an example embodiment of inventive concepts.

FIG. 7 is a block diagram schematically illustrating a polar code encoding unit according to an example embodiment of inventive concepts. Referring to FIG. 7, a polar code encoding unit 1261 may include a frozen bit inserting unit 1262 and a generation matrix calculation unit 1263.

The frozen bit inserting unit 1262 may receive information word bits I(k). The frozen bit inserting unit 1262 may insert frozen bits into the information word bits I(k). The frozen bits may be static bits fixed to a logical value such "1" or "0". That is, the frozen bits may be bits having a fixed logic value (e.g., "0" or "1"). In one example, the frozen bit inserting unit 1262 may insert frozen bits into a head or tail of the information word bits I(k) or into a given, desired or predetermined location between the head and the tail of the information word bits I(k). Locations where frozen bits are inserted may be locations decided such that an error prevention function of the polar code encoder/decoder 1260 is optimized. The frozen bit inserting unit 1262 may generate input word bits U(n) by inserting frozen bits into the information word bits I(k).

The generation matrix calculation unit 1263 may receive the input word bits U(n) from the frozen bit inserting unit 1262. The generation matrix calculation unit 1263 may generate code word bits C(n) by performing generation matrix calculation on the input word bits U(n) based on a given, desired or predetermined generation matrix.

Figure 8A:
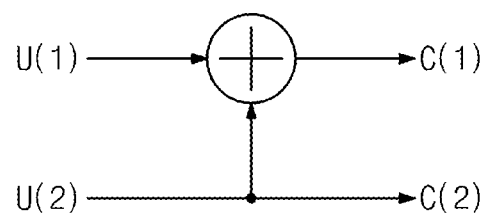
FIGS. 8A and 8B show examples of a generation matrix calculation unit.
Figure 8B:
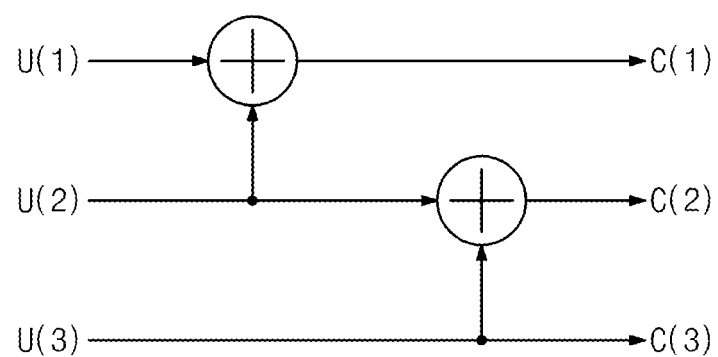

FIGS. 8A and 8B show examples of a generation matrix calculation unit 1263. Referring to FIG. 8A, there is illustrated a generation matrix calculation unit 1263_1 based a 2-by-2 generation matrix. A first code word bit C(1) may be a sum of first and second input word bits U(1) and U(2). A second code word bit C(2) may be a second input word bit U(2).

Referring to FIG. 8B, there is illustrated a generation matrix calculation unit 1263_2 based on a 3-by-3 generation matrix. A first code word bit C(1) may be a sum of first and second input word bits U(1) and U(2). A second code word bit C(2) may be a sum of second and third input word bits U(2) and U(3). A third code word bit C(3) may be a third input word bit U(3).

A generation matrix may be generated by a combination of unit matrixes having a given, desired or predetermined size as illustrated in FIGS. 8A and 8B. For example, the generation matrix may be generated based a Kronecker product of unit matrixes. Thus, the length of code word bits C(n) or input word bits U(n) supported by a generation matrix calculation unit 1263 may be limited to combinations of unit matrixes.

Puncturing may be applied to support code word bits C(n) or input word bits U(n) having a length. The puncturing may be a method of puncturing some bits of the code word bits C(n). Punctured bits may not be transferred to a channel, and bits not punctured may be transferred to the channel. That is, if puncturing is used, lengths of code word bits C(n) or input word bits U(n) may be adjusted within a range at which the reliability on error correction is secured.

However, it is difficult to apply the puncturing to polar encoding due to an inherent characteristic.

Figure 9:
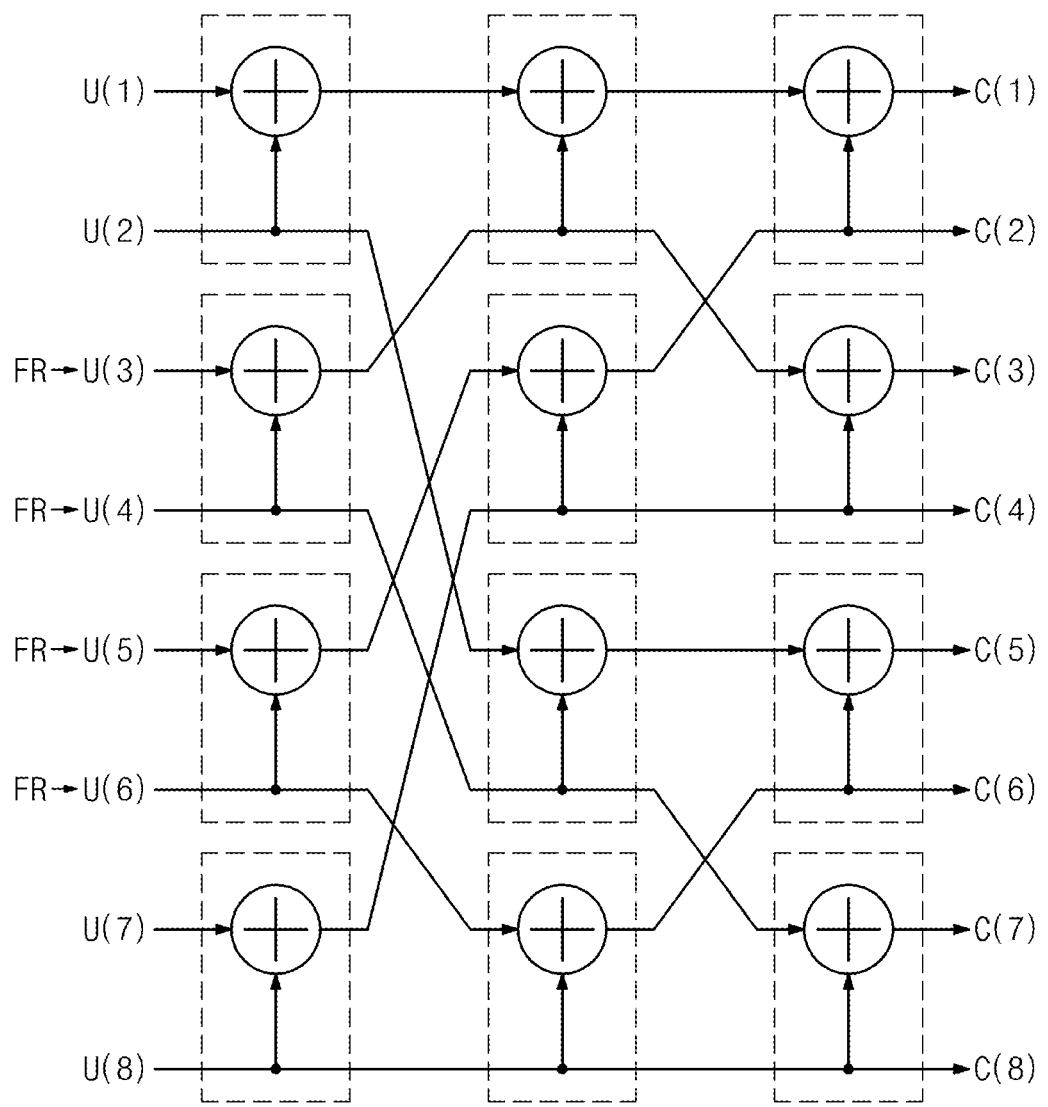
FIG. 9 shows still another example of a generation matrix calculation unit.

FIG. 9 shows still another example of a generation matrix calculation unit. Referring to FIG. 9, there is illustrated a generation matrix calculation unit based on an 8-by-8 generation matrix. The 8-by-8 generation matrix may be generated by a Kronecker product of 2-by-2 unit matrix. A generation matrix calculation unit 1263_3 may receive first to eighth input word bits U(1) to U(7) to output first to eighth code word bits C(1) to C(8).

In example embodiments, the third to sixth input word bits U(3) to U(6) may be frozen bits. Since a bit error rate (BER) of the third to sixth input word bits U(3) to U(6) may be higher than that of the first, second, seventh, and eighth input word bits U(1), U(2), U(7), and U(7), the third to sixth input word bits U(3) to U(6) may be selected as frozen bits.

Figure 10:
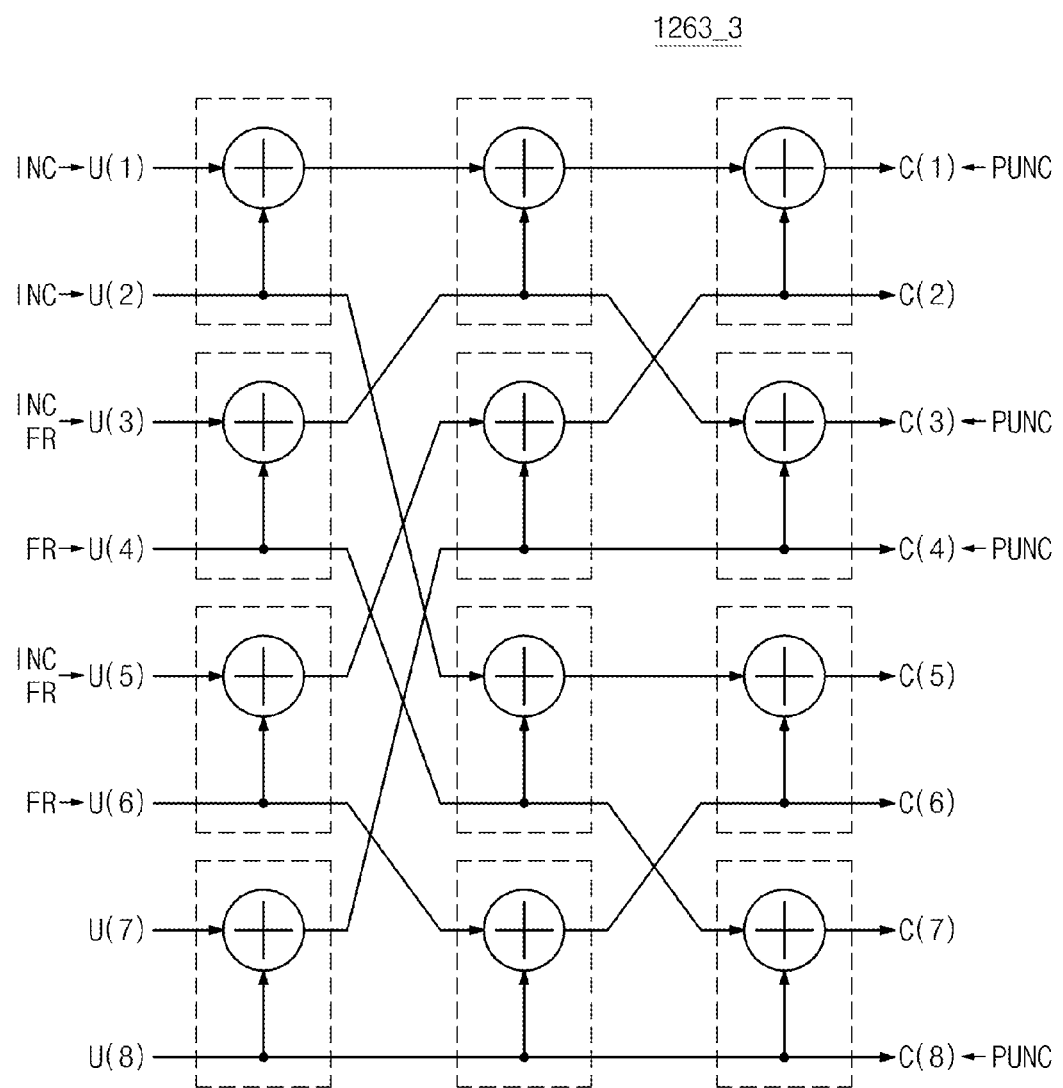
FIG. 10 shows an example in which punctuation is applied to a generation matrix calculation unit of FIG. 9.

FIG. 10 shows an example in which puncturing is applied to a generation matrix calculation unit of FIG. 9. Referring to FIG. 10, first, third, fourth, and eighth code word bits C(1), C(3), C(4), and C(8) may be punctured. If locations of puncturing bits PUNC are decided, locations of incapable bits INC may be decided. The incapable bits INC may be input word bits which have a relatively high probability of having errors after transmission due to puncturing. For example, the incapable bits INC may be input word bits which are not transferred through a channel due to puncturing.

In the case that a length of a code word C(n) or an input word U(n) is $2^P$, the incapable bits INC may be decided by the following calculation.

First, there may be defined a punctuation variable IO(n) indicating whether each bit of the code word C(n) is a puncturing bit PUNC. When an i-th code word bit C(i) is a puncturing bit PUNC, the puncturing variable IO(n) may be "0". When an i-th code word bit C(i) is not a puncturing bit PUNC, the puncturing variable IO(n) may be "1".

There may be defined a location variable L(n) indicating a location of an input word bit U(n). The location variable L(i) corresponding to an i-th input word bit U(i) may have a value expressed by the binary numeral. A value of the location variable L(i) may be expressed by binary bits. Respective bits of the location variable L(i) may be defined by b0, b1, b2, ..., bn from a most significant bit (MSB) to a least significant bit (LSB).

Calculation of the following equation 1 may be performed based on the location variable L(i) and the puncturing variable IO(n).

$$\begin{aligned}&\text{for } m = 0, \ldots, n-1 \hfill [\text{Equation 1}]\\&\text{for } k = 1, \ldots, \frac{N}{2^{m+1}}\\&\quad \text{if } b_m = 0\\&\quad\quad I^{(k)}_{m+1} = I^{(2k)}_m \wedge I^{(2k+1)}_m\\&\quad \text{else}\\&\quad\quad I^{(k)}_{m+1} = I^{(2k)}_m \vee I^{(2k+1)}_m\\&\quad \text{end}\\&\text{end}\end{aligned}$$

In the equation 1, a sign "∧" may indicate an AND operation, and a sign "∨" may indicate an OR operation.

Calculation of the formula 1 may be performed based on a value of a specific location variable L(j). If a value of the puncturing variable IO(1) is "0" after the equation 1 is calculated, an input word bit U(j) of a location corresponding to the location variable L(j) may be an incapable bit INC. If a value of the puncturing variable IO(1) is "1", an input word bit U(j) of a location corresponding to the location variable L(j) may not be an incapable bit INC.

As described above, due to a structural characteristic of the generation matrix calculation unit 1263_3, one incapable bit INC may be generated when one puncturing bit PUNC is set.

In FIG. 10, third to sixth input word bits U(3) to U(6) may be frozen bits. First to third and fifth input word bits U(1) to U(3) and U(5) may be incapable bits. Although first and second input word bits U(1) and U(2) are information word bits I(n) not being frozen bits FR, they may not be transferred to a nonvolatile memory device 1100. That is, if puncturing is applied to a polar code encoder/decoder 1260, loss of information word bits I(n) may be generated. In this case, it is impossible to normally decode information word bits I(n) at polar code decoding. This may mean that the reliability of a memory system 1000 (refer to FIG. 1) is lowered.

To solve the above-described problem, polar code encoding may be controlled such that incapable bits INC and frozen bits FR overlap. If incapable bits INC and frozen bits FR overlap, such a problem that information word bits I(n) are lost without transmission to a channel may be solved. Thus, it is possible to provide a polar code encoder/decoder which supports code word bits C(n) or input word bits I(n) having any length.

Figure 11:
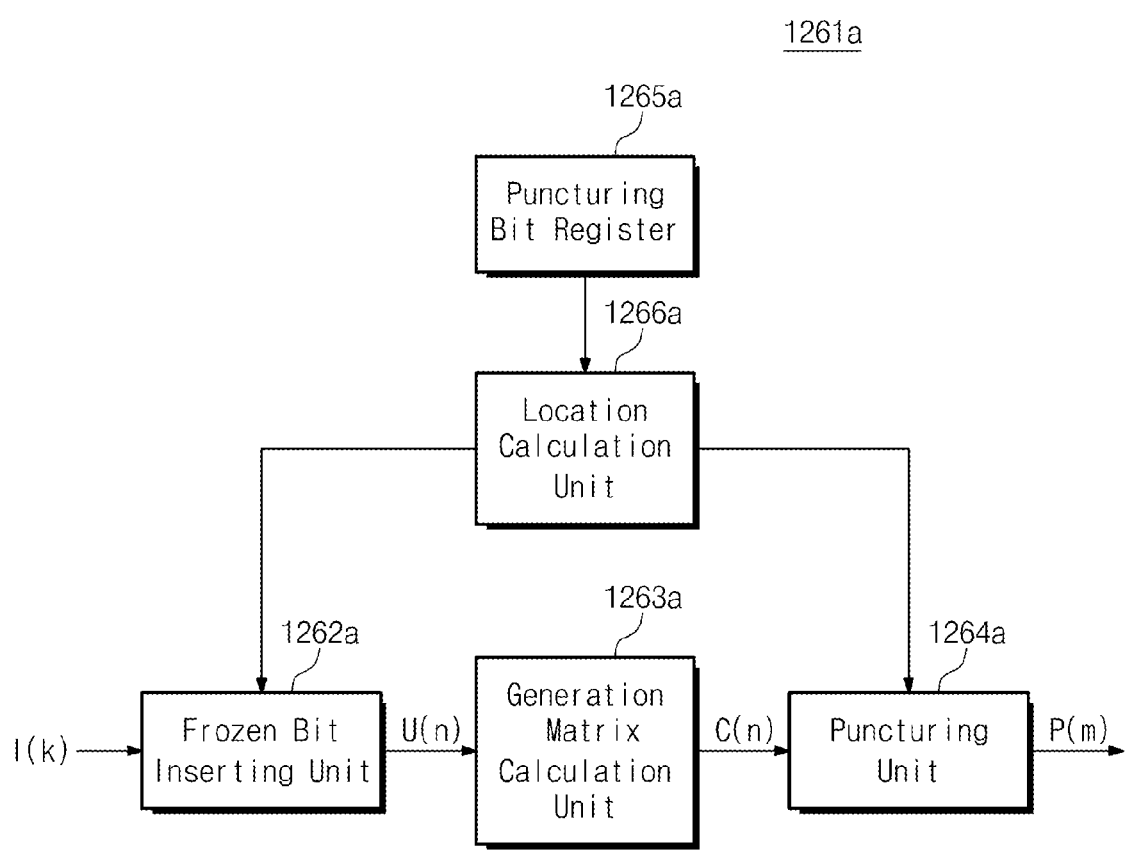
FIG. 11 is a block diagram schematically illustrating a polar code encoding unit according to another example embodiment of inventive concepts.

FIG. 11 is a block diagram schematically illustrating a polar code encoding unit according to another example embodiment of inventive concepts. Referring to FIG. 11, a polar code encoding unit 1261a may include a frozen bit inserting unit 1262a, a generation matrix calculation unit 1263a, a puncturing unit 1264a, a puncturing bit register 1265a, and a location calculation unit 1266a.

The frozen bit inserting unit 1262a may be configured to insert frozen bits FR into information word bits I(k). In example embodiments, when puncturing bits PUNC are not selected, the frozen bit inserting unit 1262a may insert frozen bits FR at reference locations of the information word bits I(k). The reference locations may be stored at the frozen bit inserting unit 1262a. The reference bits may be provided to the location calculation unit 1266a.

When puncturing bits PUNC are selected, the frozen bit inserting unit 1262a may receive information about locations of frozen bits FR from the location calculation unit 1266a. Locations of the frozen bits FR received from the location calculation unit 1266a may include locations of incapable bits INC. That is, for example, locations of the incapable bits INC may overlap with locations of the frozen bits FR. If the incapable bits INC and the frozen bits FR overlap, loss of information word bits I(k) due to puncturing may be suppressed and/or prevented.

The frozen bit inserting unit 1262a may output input word bits U(n) by inserting frozen bits FR into the information word bits I(k).

The generation matrix calculation unit 1263a may receive the input word bits U(n) from the frozen bit inserting unit 1262a. The generation matrix calculation unit 1263a may calculate a generation matrix on the input word bits U(n). The generation matrix calculation unit 1263a may output code word bits C(n) by calculating the generation matrix.

The puncturing unit 1264a may receive the code word bits C(n) from the generation matrix calculation unit 1263a. The puncturing unit 1264a may receive information about locations of puncturing bits PUNC from the location calculation unit 1266a. The puncturing unit 1264a may puncture the code word bits C(n) based on the input information. The puncturing unit 1264a may puncture the code word bits C(n) to output m output bits P(m) (m being a positive integer less than n).

The puncturing bit register 1265a may be configured to store information about puncturing bits PUNC. In example embodiments, the puncturing bit register 1265a may be accessed from an external device of a controller 1200 (refer to FIG. 5). The puncturing bit register 1265a may be a one-time programmable (OTP) register. The puncturing bit register 1265a may store information about the number of puncturing bits PUNC.

The location calculation unit 1266a may receive information (e.g., the number of puncturing bits PUNC) about puncturing bits PUNC from the puncturing bit register 1265a. The location calculation unit 1266a may calculate locations of frozen bits FR based on the input information.

In example embodiments, the location calculation unit 1266a may receive information about the number and locations of puncturing bits PUNC from the puncturing bit register 1265a. The location calculation unit 1266a may calculate locations of incapable bits INC based on information about locations of puncturing bits PUNC and a structure of a generation matrix calculation unit 1263a. The location calculation unit 1266a may adjust locations of frozen bits FR such that the frozen bits overlap with the incapable bits INC. An operation of adjusting locations of the frozen bits FR may be referred to refrozen. Information associated with a structure of the generation matrix calculation unit 1263a may be stored (e.g., previously stored) at the location calculation unit 1266a. Information associated with a structure of the generation matrix calculation unit 1263a may include an algorithm for calculating locations of incapable bits INC from locations of puncturing bits PUNC based on a structure of the generation matrix calculation unit 1263a as described with reference to the equation 1.

In example embodiments, the location calculation unit 1266a may receive information about the number of puncturing bits PUNC from the puncturing bit register 1265a. The location calculation unit 1266a may calculate locations of puncturing bits PUNC based on information about the number of puncturing bits PUNC and information associated with a structure of the generation matrix calculation unit 1263a. For example, the location calculation unit 1266a may calculate locations of puncturing bits PUNC such that a bit error rate BER of a polar code encoder/decoder 1260 (refer to FIG. 5) is reduced and/or minimized. Afterwards, the location calculation unit 1266a may perform refrozen.

Figure 12:
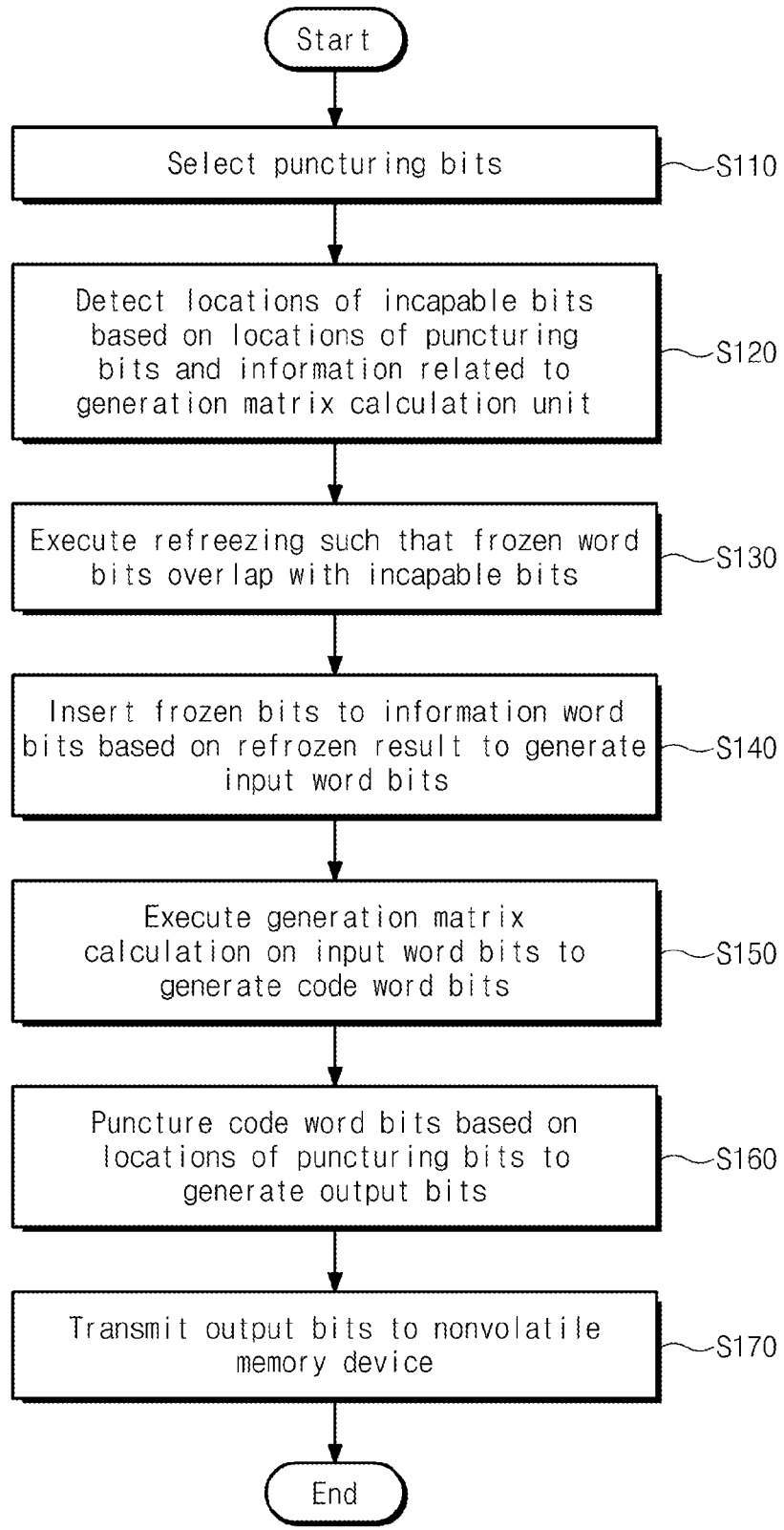
FIG. 12 is a flow chart schematically illustrating an operation of a polar code encoding unit.

FIG. 12 is a flow chart schematically illustrating an operation of a polar code encoding unit 1261a. Referring to FIGS. 11 and 12, in operation S110, puncturing bits PUNC may be selected. For example, the puncturing bits PUNC may be selected by storing information of the puncturing bits PUNC at a puncturing bit register 1265a or reading information of the puncturing bits PUNC from puncturing bit register 1265a. For example, the number of the puncturing bits PUNC or the number and locations of the puncturing bits PUNC may be selected. In the case that information about the number of the puncturing bits PUNC is stored at the puncturing bit register 1265a, selecting of the puncturing bits PUNC may further include an operation of calculating locations of the puncturing bits PUNC.

In operation S120, locations of incapable bits INC may be detected based on locations of the puncturing bits PUNC and information associated with a generation matrix calculation unit 1263a. The operation S120 may be performed by the location calculation unit 1266a.

In operation S130, refreezing may be performed such that frozen bits FR overlap with incapable bits INC. The refreezing may be performed by the location calculation unit 1266a.

In operation S140, a frozen bit inserting unit 1262a may generate input word bits U(n) by inserting the frozen bits FR to information word bits I(k) based on a refrozen result.

In operation S150, a generation matrix calculation unit 1263a may generate code word bits by performing generation matrix calculation on the input word bits U(n).

In operation S160, a puncturing unit 1264a may generate output bits P(m) by puncturing the code word bits C(n) based on locations of the puncturing bits PUNC.

In operation S170, the output bits P(m) may be transmitted to a nonvolatile memory device 1100 (refer to FIG. 1). The nonvolatile memory device 1100 may program the input output bits P(m).

Figure 13:
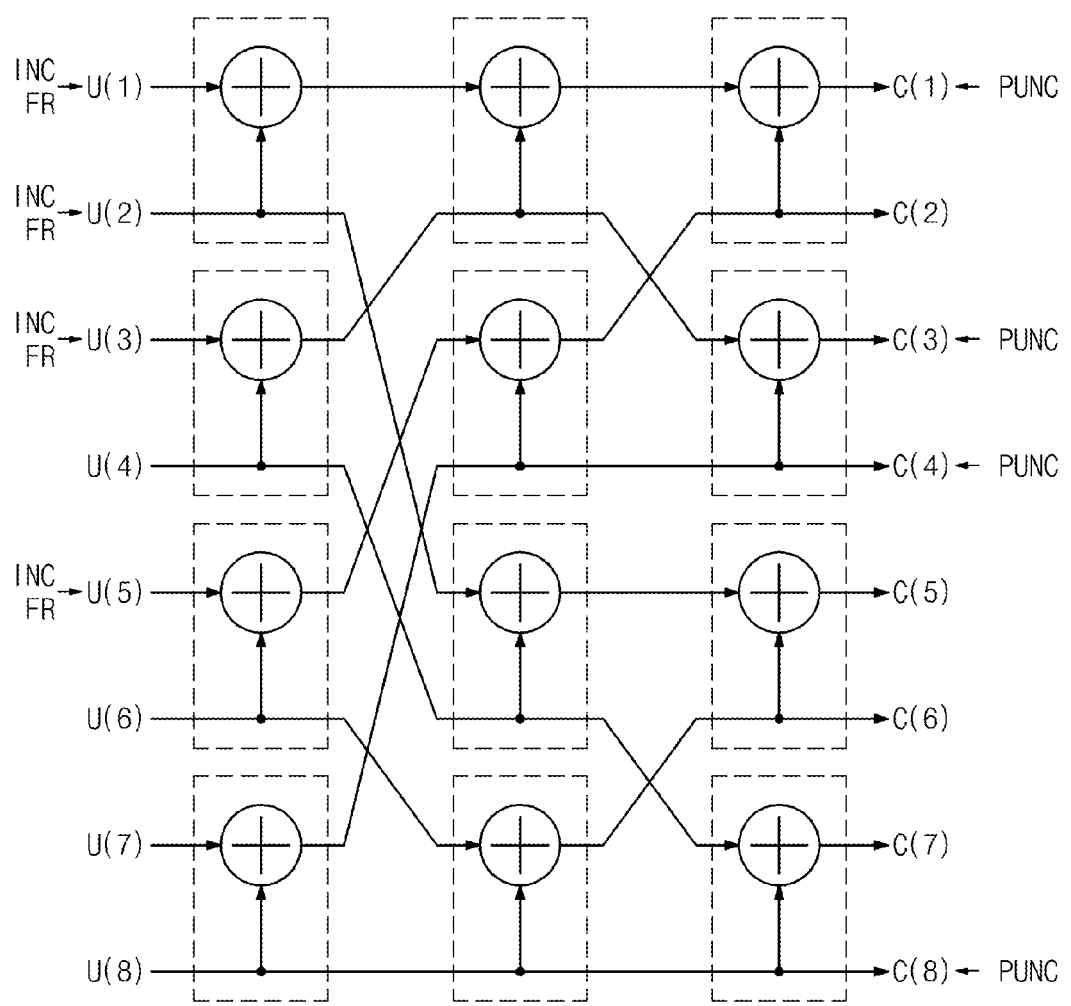
FIG. 13 shows a refrozen result of a generation matrix calculation unit of FIG. 10.

FIG. 13 shows a refrozen result of a generation matrix calculation unit 1263_3 of FIG. 10. Referring to FIG. 13, frozen bits FR may be moved to overlap with incapable bits INC. If the frozen bits FR overlap with the incapable bits INC, then loss of information word bits I(k) may be suppressed and/or prevented, and a polar code encoder/decoder 1260 may be provided which maintains the reliability and supports a code word C(n) having a variable length.

Figure 14:
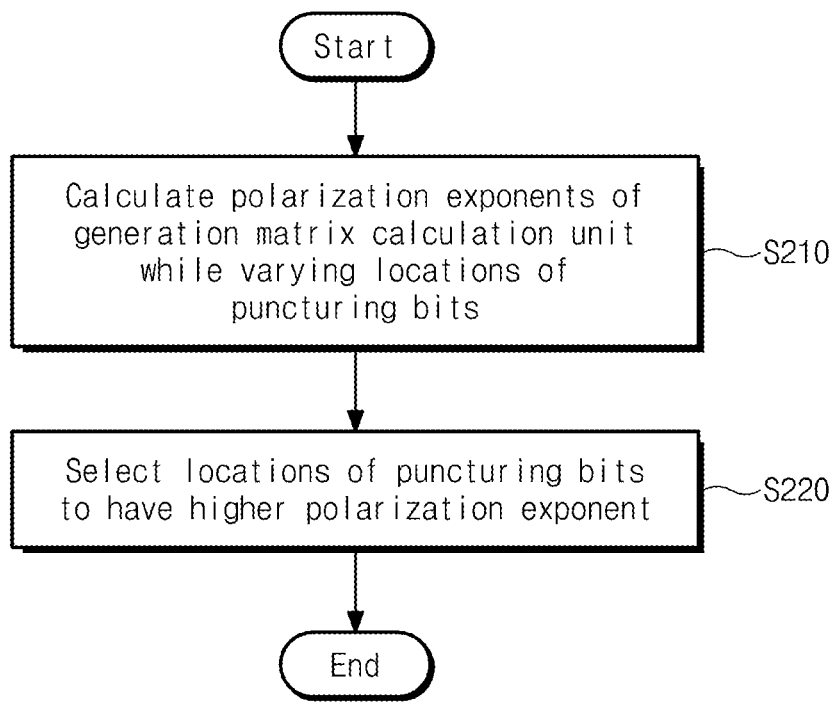
FIG. 14 is a flow chart schematically illustrating a punctuation bit selecting operation of FIG. 12 according to an example embodiment of inventive concepts.

FIG. 14 is a flow chart schematically illustrating a puncturing bit selecting operation of FIG. 12 according to an example embodiment of inventive concepts. In FIG. 14, there may be illustrated a manner of calculating locations of puncturing bits PUNC when information about the number of puncturing bits is stored at a puncturing bit register 1265a. The operation of FIG. 14 may be executed by a location calculation unit 1266a.

Referring to FIGS. 11 and 14, in operation S210, polarization exponents of a generation matrix calculation unit 1263a may be calculated while varying locations of puncturing bits PUNC.

In operation S220, locations of the puncturing bits PUNC having a higher polarization exponent (e.g., the highest polarization exponent) of the calculated polarization exponents. If locations of the puncturing bits PUNC having a higher polarization exponent are selected, then a polarization exponent of a generation matrix calculation unit 1263a may be optimized. If the polarization exponent of the generation matrix calculation unit 1263a is optimized, then a bit error rate BER of a polar code encoder/decoder 1260 (refer to FIG. 5) may be reduced and/or minimized.

Figure 15:
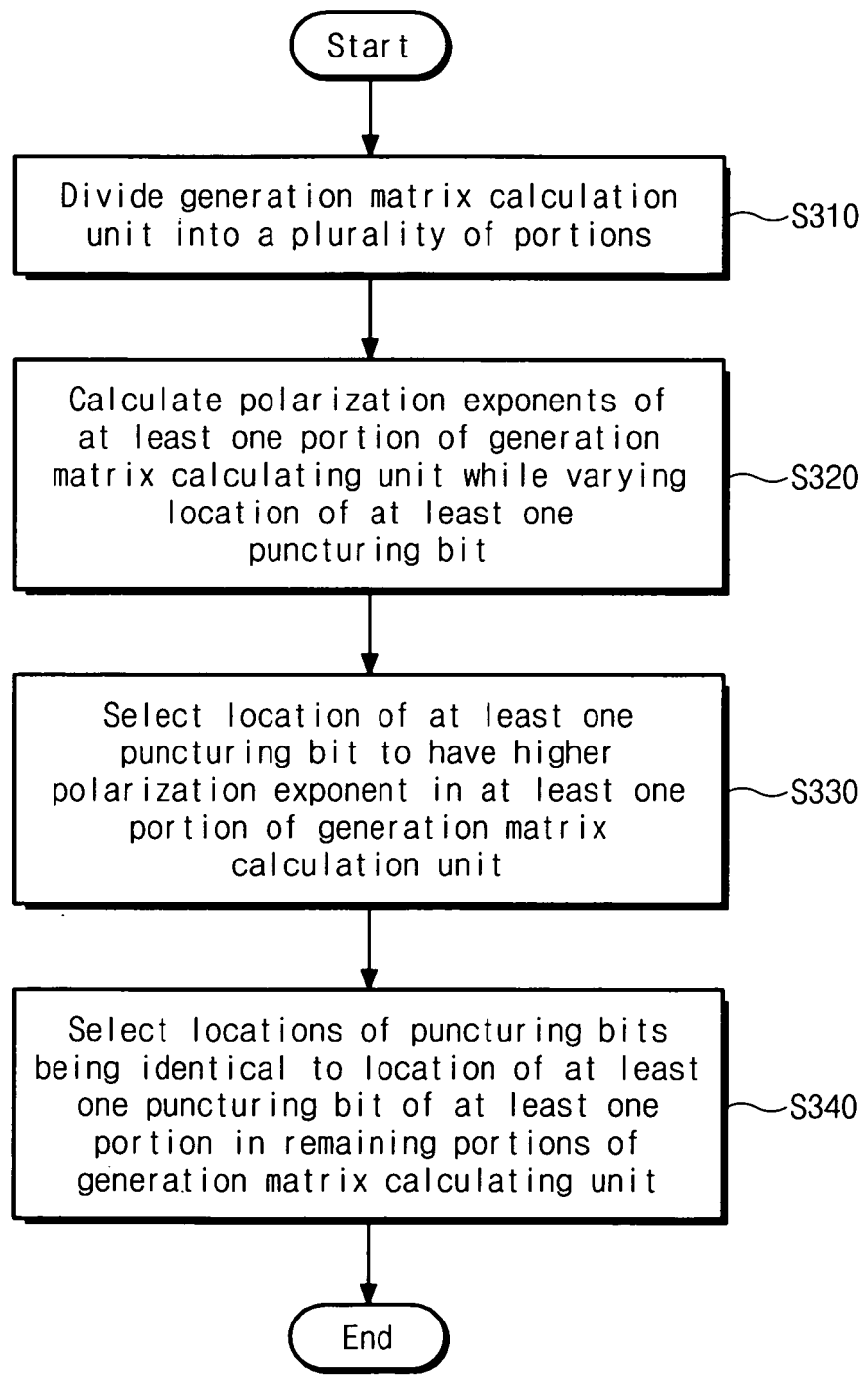
FIG. 15 is a flow chart schematically illustrating a punctuation bit selecting operation of FIG. 12 according to another example embodiment of inventive concepts.

FIG. 15 is a flow chart schematically illustrating a puncturing bit selecting operation of FIG. 12 according to another example embodiment of inventive concepts. Referring to FIGS. 11 and 15, in operation S310, a generation matrix calculation unit 1263a may be divided into a plurality of portions.

In operation S320, polarization exponents of at least one portion of the generation matrix calculation unit 1263a may be calculated while varying a location of at least one punctuation bit.

In operation S330, there may be selected a location of at least one puncturing bit, having a higher (or, highest) polarization exponent, from at least one portion of the generation matrix calculation unit 1263a.

In operation S340, there may be selected locations of puncturing bits, having the same location as the at least one puncturing bits of the at least one portion, in the remaining portions.

In example embodiments, in the case that a size of the generation matrix calculation unit 1263a is large due to a long length of code word bits C(n), a time taken to search all locations of puncturing bits PUNC may be long. To search locations of the puncturing bits PUNC within a shorter time, the generation matrix calculation unit 1263a may be divided into a plurality of portions, and polarization exponents on one of the plurality of portions may be calculated. At least one puncturing bit in the at least one portion of the generation matrix calculation unit 1263a may be selected. In the remaining portions of the generation matrix calculating unit 1263a, a bit having the same location as the at least one puncturing bit selected may be selected as a puncturing bit. In example embodiments, locations of puncturing bits PUNC having a reduced bit error rate BER may be searched by searching one portion of the generation matrix calculation unit 1263a, not the whole of the generation matrix calculation unit 1263a.

Variables N1 and N2 may be defined to divide the generation matrix calculation unit 1263a. The variables N1 and N2 may be defined by the following equation 2.

$$N1=2^k, N2=2^{m-k}$$ [Equation 2]

Herein, a code length of a code word C(n) may be 2^m, and "k" may be a positive integer less than "m".

In example embodiments, the variables N1 and N2 may be expressed by the base 2 exponentiation. However, inventive concepts are not limited thereto. The variables N1 and N2 may be expressed by a composite number. For example, the variables N1 and N2 may be expressed by the following equation 3.

$$N1=p1^{n1}, N2=p2^{n2}$$ [Equation 3]

In the equation 3, "p1" and "p2" may be different prime numbers, and "n1" and "n2" may be a positive integer.

Below, for ease of description, inventive concepts may be described under a condition that the variables N1 and N2 are expressed by the equation 2.

A generation matrix of the generation matrix calculation unit 1263a may be expressed by the following equation 4, based on the equation 3.

$$G=Ia(I_{N1} \otimes G_{N2})D(I_{N2} \otimes G_{N1})$$ [Equation 4]

Herein, an operator ($\otimes$) may indicate a Kronecker product, a matrix (Ia) may indicate an Identity matrix having a size of a by a, and a matrix (D) may indicate a permutation matrix having the same length as a code word C(n).

With the equation 4, the generation matrix calculation unit 1263a may be divided into a portion corresponding to the variable N1 and portions corresponding to the variable N2 by a variable (k). The portions corresponding to the variables N1 and N2 may correspond to respective stages.

Figure 16:
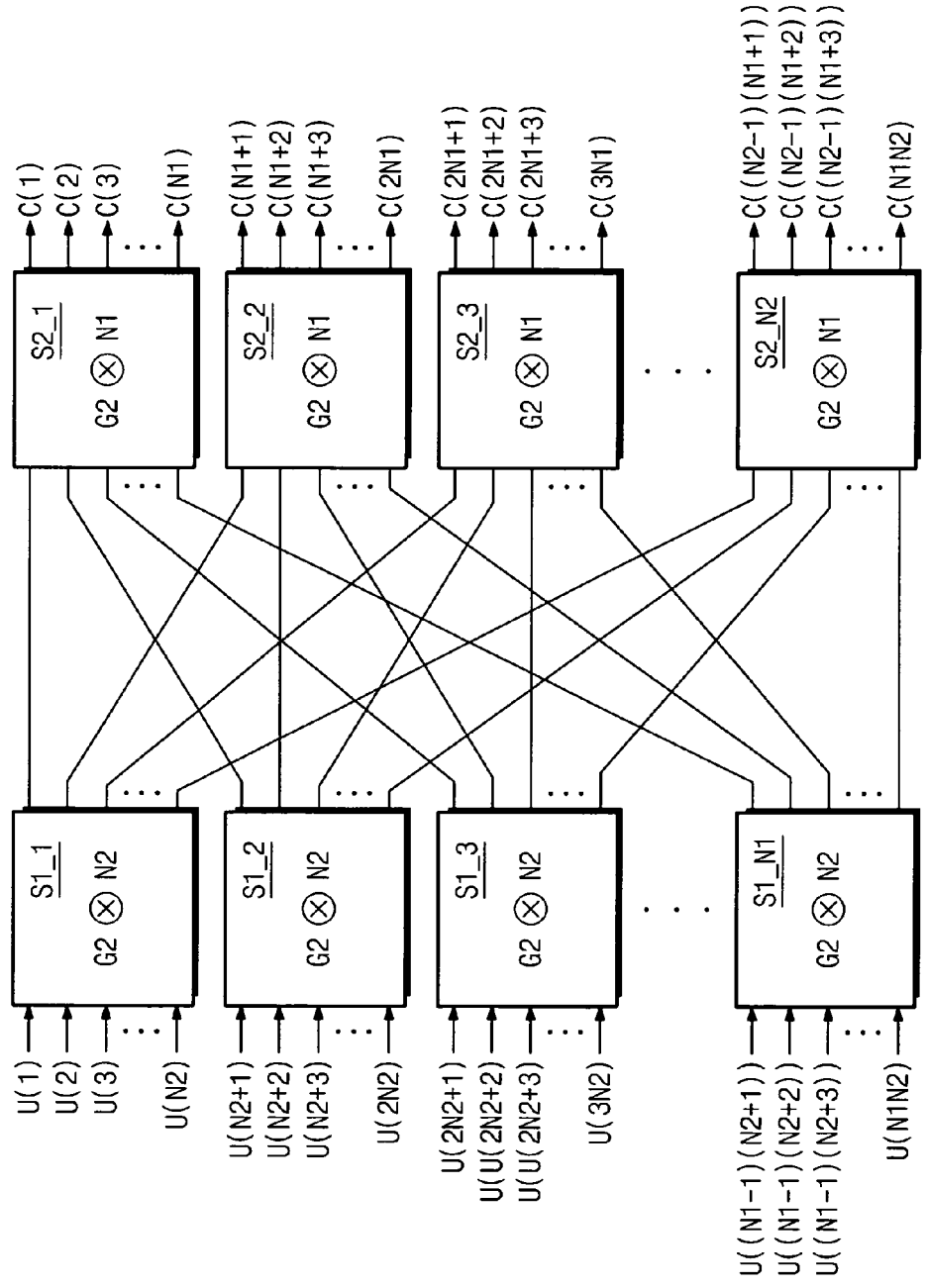
FIG. 16 shows an example of division of a generation matrix calculation unit.

In FIG. 16, there may be illustrated a generation matrix calculation unit 1263 divided when the variable (k) is 2.

FIG. 16 shows an example of division of a generation matrix calculation unit. Referring to FIG. 16, a generation matrix calculation unit 1263a may be divided into a plurality of stages (e.g., two stages). Each stage may be divided into a plurality of portions by a square matrix unit.

A first stage may include a plurality of blocks S1_1 to S1_N1. Each block in the first stage may receive N2 input word bits.

A second stage may include a plurality of blocks S2_1 to S2_N2. Each block in the second stage may receive N1 input word bits.

For example, polarization exponents according to a location of a puncturing bit may be calculated at one of the blocks S2_1 to S2_N2 in the second state. A location, corresponding to the highest polarization exponent, from among locations of a puncturing bit may be selected as a location of a puncturing bit. Afterwards, in the blocks S2_1 to S2_N2 of the second state, code word bits at the selected location may be selected as puncturing bits PUNC.

Figure 17:
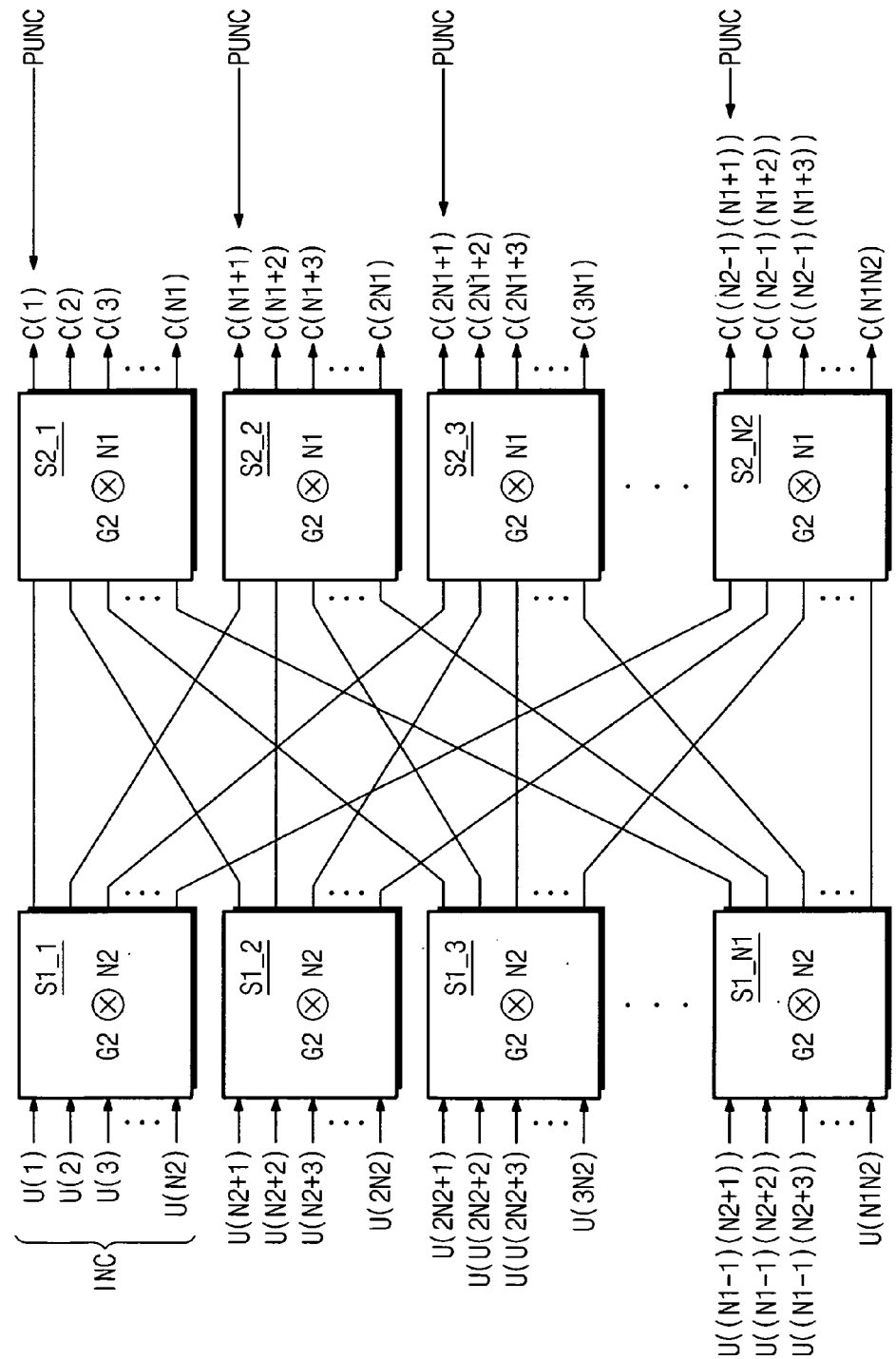
FIG. 17 shows a first example of selection of punctuation bits.

A first example of selection of puncturing bits may be illustrated in FIG. 17. Referring to FIG. 17, in each of the blocks S2_1 to S2_N2 of a second stage, a first code word bit may be selected as a puncturing bit. That is, in the second stage, locations of puncturing bits PUNC may be periodic.

If puncturing bits PUNC are periodically selected at the second stage, then incapable bits INC may be shown in terms of block (or, to be blockwise) at a first stage. For example, input word bits of a first block S1_1 of a plurality of blocks S1_1 to S1_N1 in the first stage may be incapable bits INC.

Figure 18:
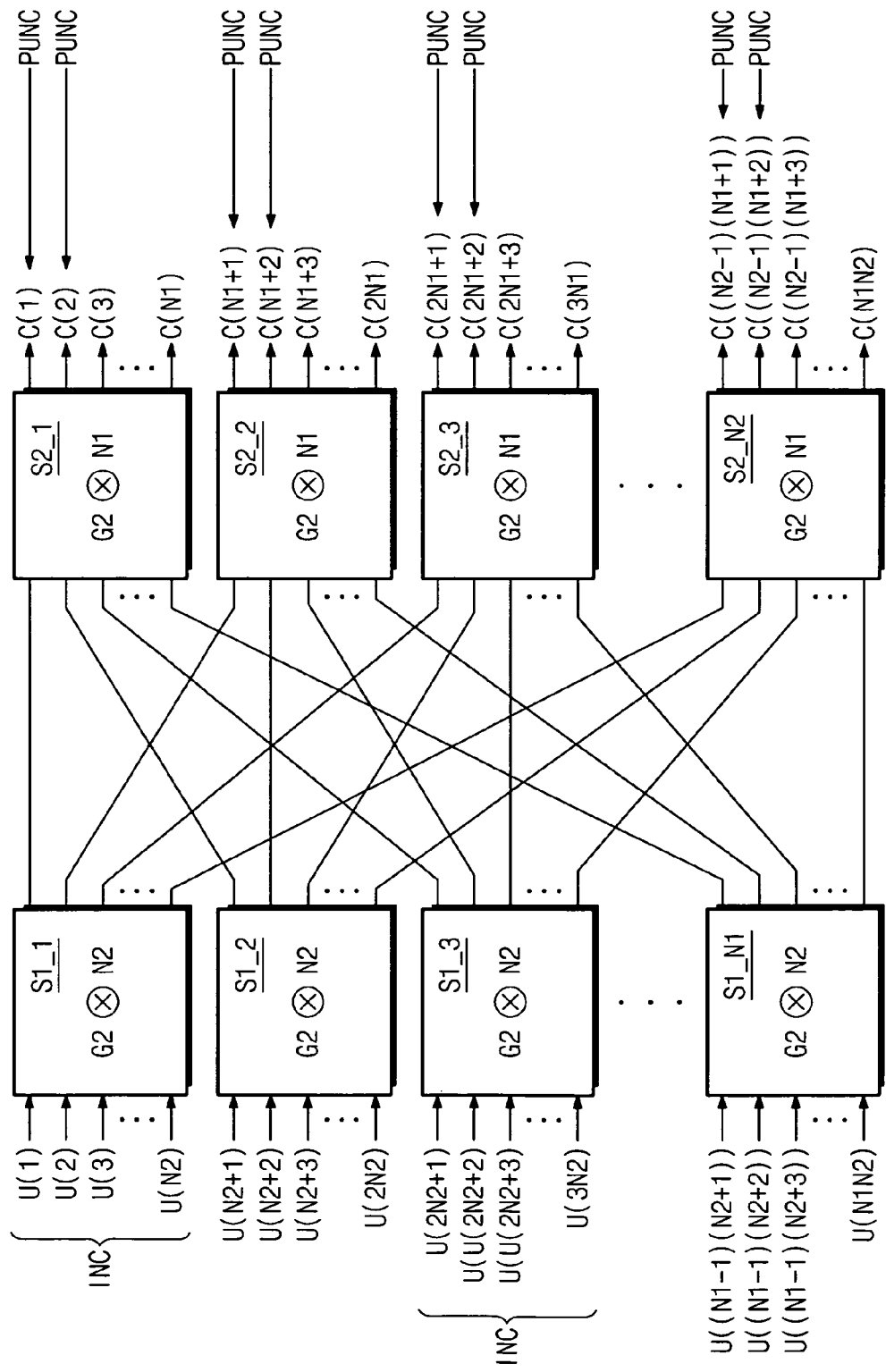
FIG. 18 shows a second example of selection of punctuation bits.

A second example of selection of puncturing bits may be illustrated in FIG. 18. Compared with FIG. 17, second code word bits of blocks S2_1 to S2_N2 in a second stage may be selected as puncturing bits. At this time, input word bits of a third block S1_3 in a first stage may be further selected as incapable bits INC.

Figure 19:
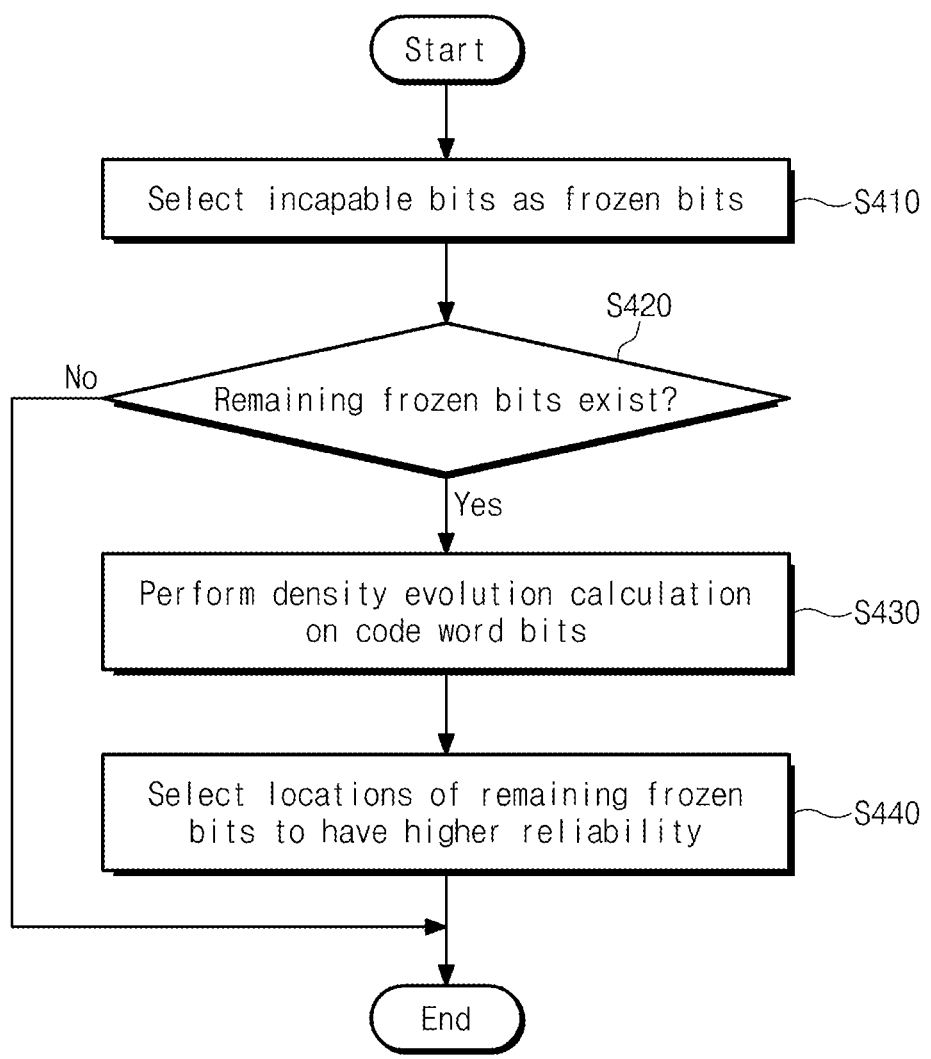
FIG. 19 is a flow chart schematically illustrating a refrozen performing method according to an example embodiment of inventive concepts.

FIG. 19 is a flow chart schematically illustrating a refreezing method according to an example embodiment of inventive concepts. The refreezing method in FIG. 19 may correspond to operation S130 in FIG. 12. Referring to FIGS. 11 and 19, in operation S410, incapable bits may be selected as frozen bits.

In operation S420, whether remaining frozen bits exist may be determined. For example, when the number of incapable bits is less than the number of frozen bits, remaining frozen bits may exist. If the number of incapable bits is equal or more than the number of frozen bits, then frozen bits may not exist. If frozen bits do not exist, then refreezing may be ended. If remaining frozen bits exist, then the method proceeds to operation S430.

In operation S430, density evolution on code word bits C(n) may be calculated. For example, density evolution on output bits P(m), not punctured, from among the code word bits C(n) may be calculated. The density evolution may be calculated based on a log likelihood ratio (LLR) of the code word bits C(n).

For example, the LLR of the code word bits C(n) may be L1(n). Probability density functions of the log likelihood ratios L1(n) may be P1(L1(n)). If density evolution is calculated, log likelihood ratios L2(n) of input word bits U(n) and probability density functions P2(L2(n)) of the log likelihood ratios L2(n) may be acquired using the probability density functions P1(L1(n)) of the code word bits C(n).

In operation S440, remaining frozen bits may be selected to have the higher (e.g., highest) reliability.

Assuming that values of the input word bits U(n) are "0", a bit error rate Pe of an input word bit may be defined by the following equation 5.

$$P_e(j, u_j \neq \hat{u}) = \int_{-\infty}^{1} P2(L2(j)) dL2(j)$$ [Equation 5]

In equation 5, the bit error rate Pe is an integral in the form of $\int_{-\infty}^{1} f(x)dx$, where x is the log likelihood ratio L2(j) of a $j^{th}$ bit. As a bit error rate Pe increases, the reliability of a corresponding input word bit may decrease.

If code word bits C(n) are punctured, then log likelihood ratios of punctured code word bits may vary. If log likelihood ratios of punctured code word bits vary, then the whole probability density functions P1(L1(n)) of the code word bits C(n) may vary. If density evolution may be calculated based on the varied probability density functions P1(L1(n)), then a reliability order of the input word bits may vary. Thus, input word bits selected as frozen bits may also vary.

That is, if the code word bits C(n) are not punctured, then frozen bits FR may exist at reference locations. If the code word bits C(n) are punctured, then locations of the frozen bits FR may vary. For example, locations of the frozen bits may be varied to include incapable bits INC and changed according to a reliability order of input word bits U(n).

Figure 20:
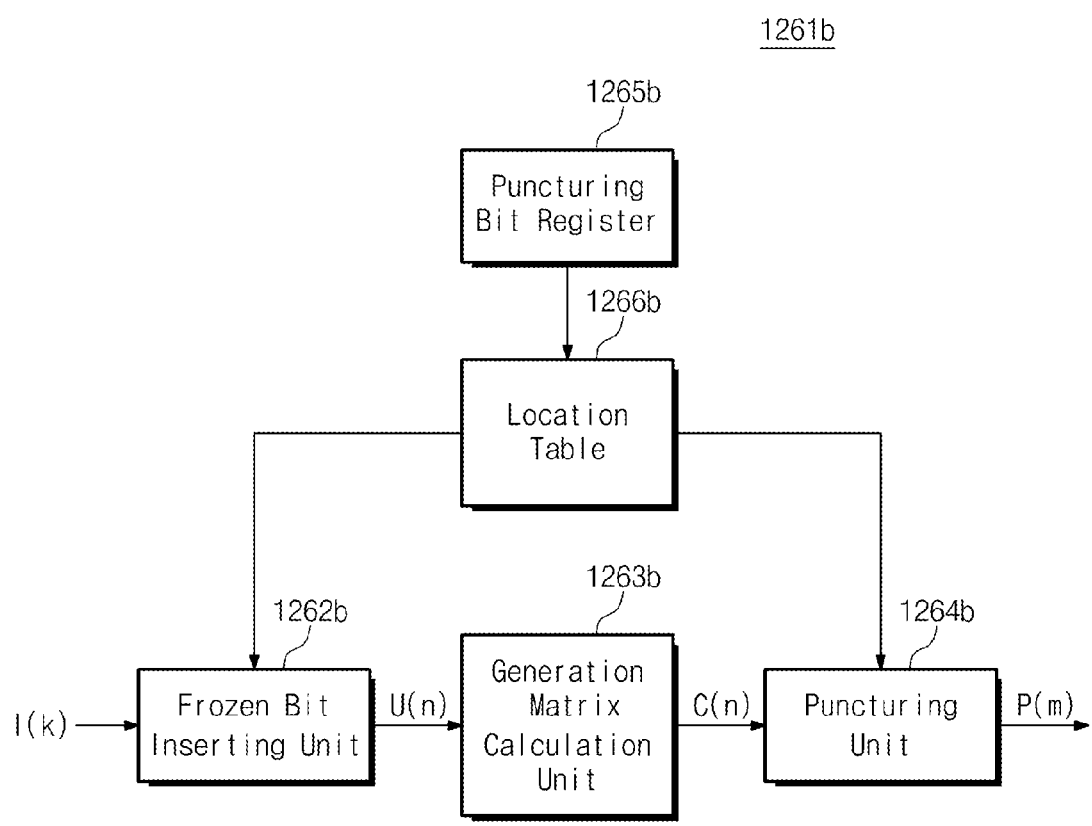
FIG. 20 is a block diagram schematically illustrating a polar code encoding unit according to an example embodiment of inventive concepts.

FIG. 20 is a block diagram schematically illustrating a polar code encoding unit according to an example embodiment of inventive concepts. Referring to FIG. 20, a polar code encoding unit 1261b may include a frozen bit inserting unit 1262b, a generation matrix calculation unit 1263b, a puncturing unit 1264b, a puncturing bit register 1265b, and a location table 1266b.

The frozen bit inserting unit 1262b, the generation matrix calculation unit 1263b, the puncturing unit 1264b, and the puncturing bit register 1265b may operate substantially the same as the frozen bit inserting unit 1262a, the generation matrix calculation unit 1263a, the puncturing unit 1264a, and the puncturing bit register 1265a described with reference to FIG. 11. Accordingly, a description of these components is omitted.

The location table 1266b may store information associated with puncturing bits PUNC, incapable bits INC, and frozen bits FR. For example, when the number and locations of puncturing bits PUNC are stored at the puncturing bit register 1265b, the location table 1266b may store locations of the frozen bits FR according to locations of puncturing bits PUNC. When the number of the puncturing bits PUNC is stored at the puncturing bit register 1265b, the location table 1266b may store locations of puncturing bits PUNC according to puncturing bits PUNC and locations of the frozen bits FR according to the locations of the puncturing bits PUNC.

Locations of the frozen bits FR stored in the location table 1266b may include locations of incapable bits INC. As the number or locations of the puncturing bits PUNC vary, the location table 1266b may provide locations of different frozen bits FR.

Information stored in the location table 1266b may be previously stored when a controller 1200 (refer to FIG. 5) is fabricated.

Figure 21:
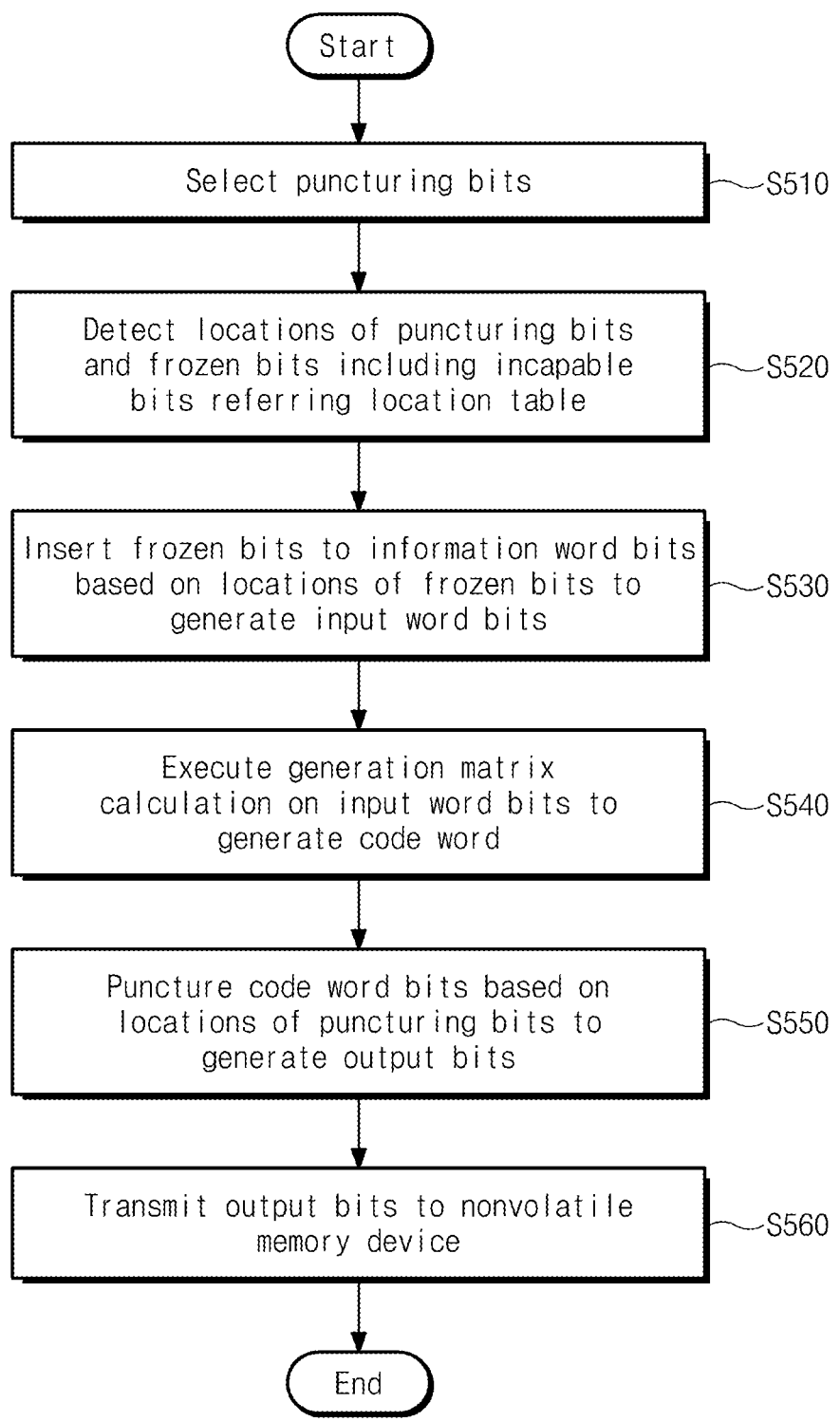
FIG. 21 is a flow chart schematically illustrating an operation of a polar code encoding unit in FIG. 20.

FIG. 21 is a flow chart schematically illustrating an operation of a polar code encoding unit in FIG. 20. Referring to FIGS. 20 and 21, in operation S510, the number of puncturing bits PUNC may be received. For example, the number of puncturing bits PUNC may be received by storing information about the number of puncturing bits PUNC at a puncturing bit register 1265b or reading information about the number of puncturing bits PUNC from the puncturing bit register 1265b.

In operation S520, locations of puncturing bits PUNC and frozen bits FR and including incapable bits INC may be detected using a location table 1266b. An operation of detecting locations of the puncturing bits PUNC and the frozen bits FR may correspond to operations S120 and S130 in FIG. 12. Calculation on locations of puncturing bits PUNC, calculation on locations of incapable bits INC, and refrozen of frozen bits FR may be skipped by referring to the location table 1266b.

In operation S530, input word bits U(n) may be generated by inserting frozen bits FR to information word bits I(k) based on locations of frozen bits. In operation S540, a generation matrix on the input word bits U(n) may be calculated to generate code word bits C(n). In operation S550, output bits P(m) may be generated by puncturing code word bits C(n) based on the locations of the puncturing bits PUNC. In operation S560, the output bits P(m) may be sent to a nonvolatile memory device 1100 (refer to FIG. 1). Operations S530 to S560 may correspond to operations S140 to S170 in FIG. 12, respectively.

Figure 22:
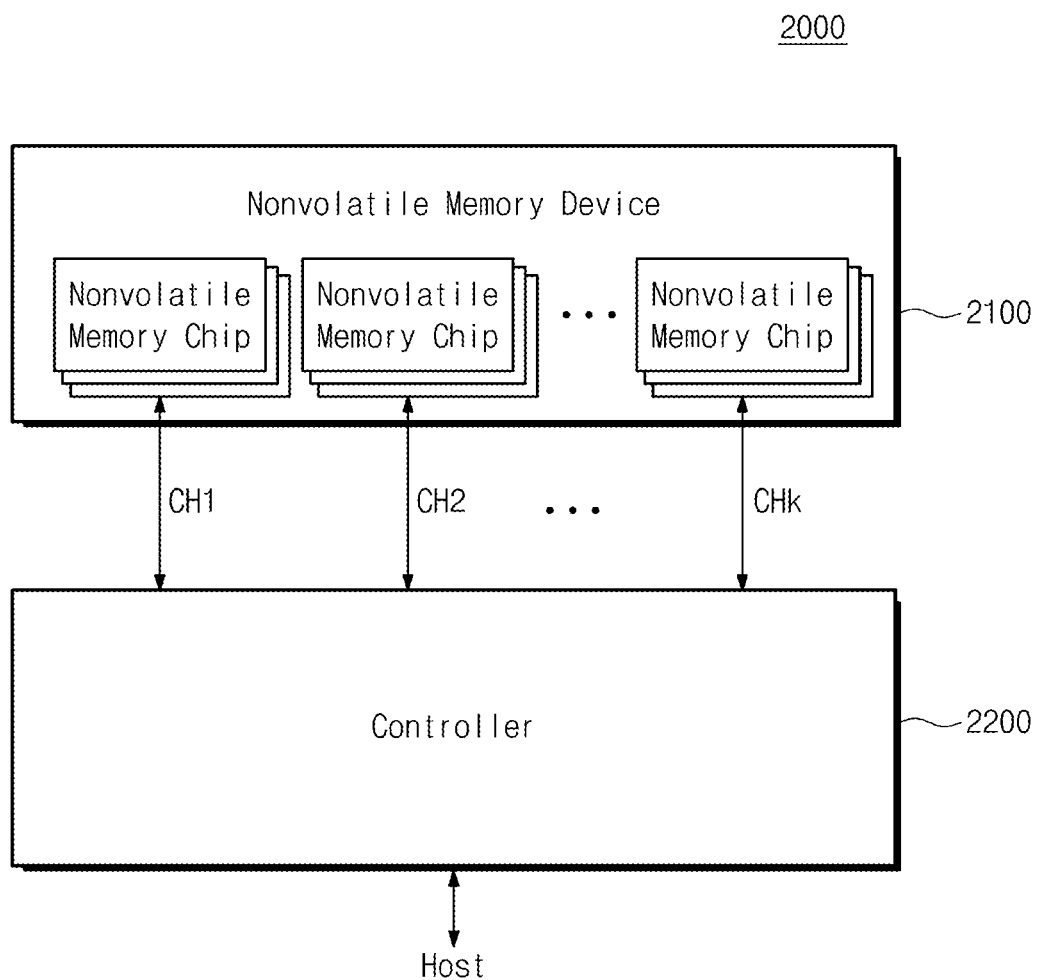
FIG. 22 is a block diagram illustrating an application of a memory system in FIG. 1.

FIG. 22 is a block diagram illustrating an application of a memory system in FIG. 1. Referring to FIG. 22, a memory system 2000 may include a nonvolatile memory 2100 and a controller 2200. The nonvolatile memory 2100 may include a plurality of nonvolatile memory chips, which form a plurality of groups. Nonvolatile memory chips in each group may be configured to communicate with the controller 2200 via one common channel. In example embodiments, the plurality of nonvolatile memory chips may communicate with the controller 2200 via a plurality of channels CH1 to CHk.

In FIG. 22, there is described such as case that one channel is connected with a plurality of nonvolatile memory chips. However, the memory system 2000 can be modified such that one channel is connected with one nonvolatile memory chip.

Figure 23:
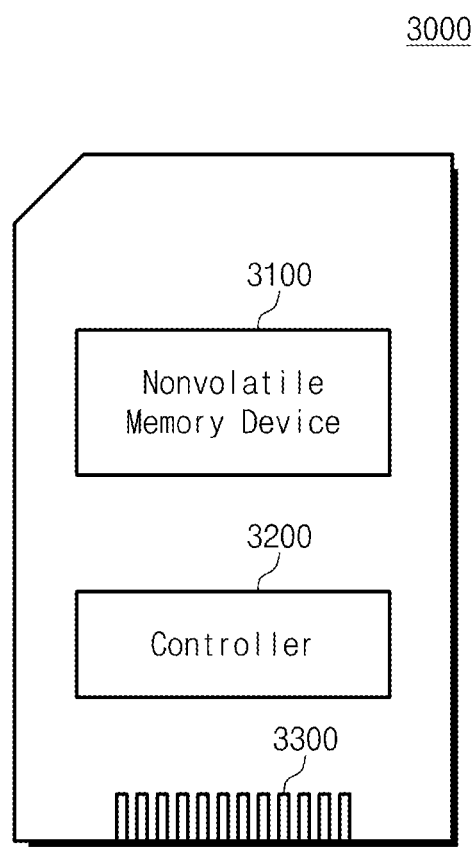
FIG. 23 is a diagram illustrating a memory card according to an example embodiment of inventive concepts.

FIG. 23 is a diagram illustrating a memory card according to an example embodiment of inventive concepts. Referring to FIG. 23, a memory card 3000 may include a nonvolatile memory 3100, a controller 3200, and a connector 3300.

The connector 3300 may connect the memory card 3000 electrically with a host.

The memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and so on.

Figure 24:
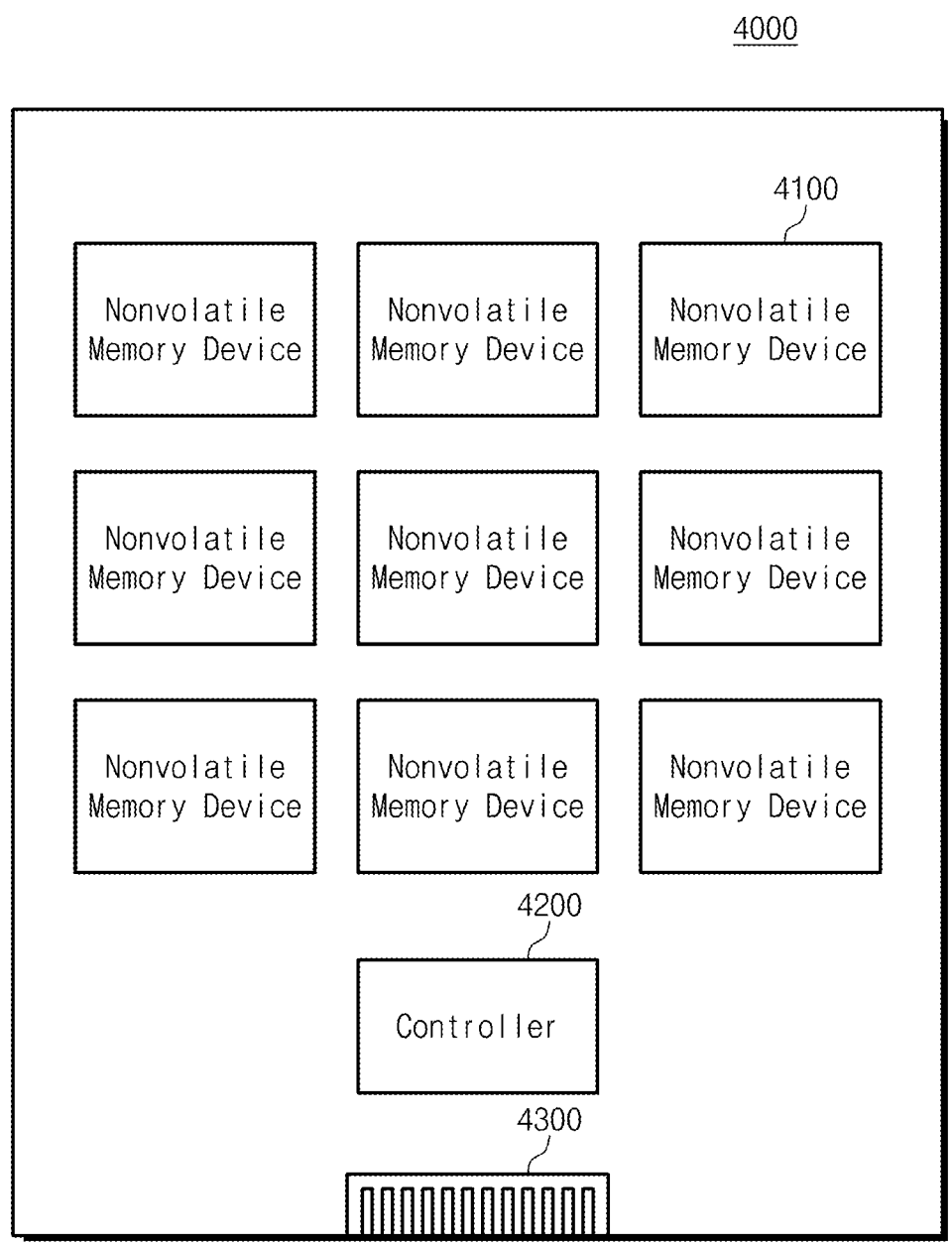
FIG. 24 is a diagram illustrating a solid state drive according to an example embodiment of inventive concepts.

FIG. 24 is a diagram illustrating a solid state drive according to an example embodiment of inventive concepts. Referring to FIG. 24, a solid state drive 4000 may include a plurality of nonvolatile memories 4100, a controller 4200, and a connector 4300.

The connector 4300 may connect the solid state driver 4000 electrically with a host.

Figure 25:
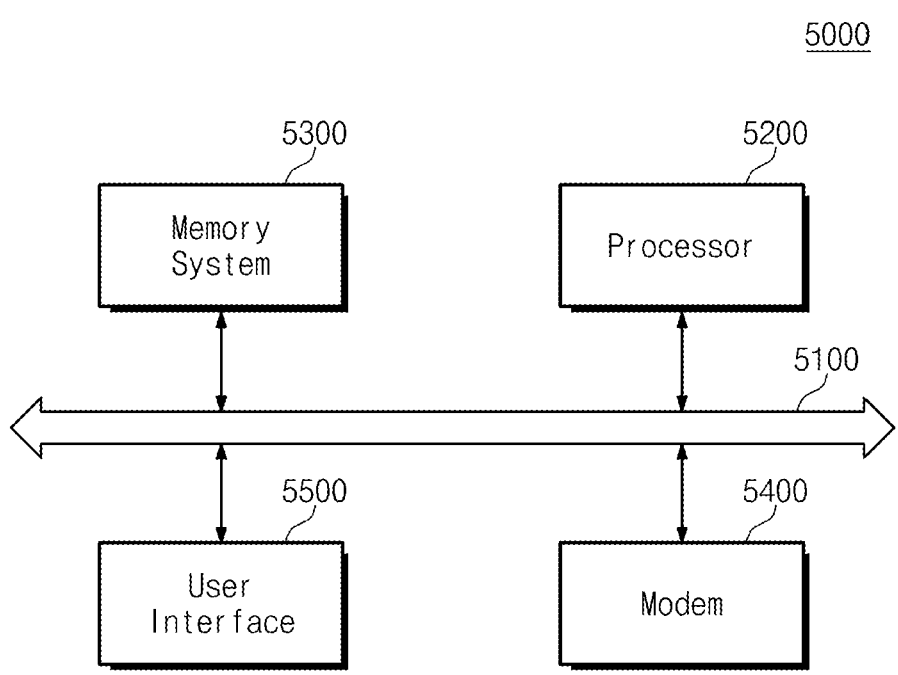
FIG. 25 is a block diagram schematically illustrating a computing system according to an example embodiment of inventive concepts.

FIG. 25 is a block diagram schematically illustrating a computing system according to an example embodiment of inventive concepts. Referring to FIG. 25, a computing system 5000 may include a bus 5100, a processor 5200, a memory system 5300, a modem 5400, and a user interface 5500.

The bus 5100 may provide a channel among components of the computing system 5000.

The processor 5200 may control an overall operation of the computing system 5000 and perform a logical operation.

The memory system 5300 may include a memory system 1000 or 2000 according to an example embodiment of inventive concepts. The memory system 5300 can be used as a working memory or storage of the computing system 5000. The working memory may be a storage space which the processor 5200 uses to control the computing system 5000. The storage may be a storage space which the computing system 5000 uses to retain data for the long term.

When the memory system 5300 is used as the working memory, the computing system 5000 may further include separate storage. When the memory system 5300 is used as the storage, the computing system 5000 may further include a separate working memory.

The modem 5400 may perform wire or wireless communications with an external device.

The user interface 5500 may include user input interfaces such as a camera, a keyboard, a mouse, a microphone, a touch pad, a touch panel, a button, a sensor, and so on and user output interfaces such as a display, a speaker, a ramp, a motor, and so on.

The computing system 5000 may be mobile multimedia devices such as a smart phone, a smart pad, and so on or multimedia devices such as a smart television, a smart monitor, a computer, a notebook computer, and so on.

With example embodiments of inventive concepts, a code word encoded may be punctured, and an input word may be refrozen. If the input word is refrozen, lowering of the reliability due to puncturing may be suppressed and/or prevented. Thus, it is possible to support code words having various lengths using a polar code encoder/decoder over maintaining the reliability.

While inventive concepts have been described with reference to example embodiments, it will be apparent to those skilled in the art that various changes and modifications may be made without departing from the spirit and scope of the present invention. Therefore, it should be understood that the above example embodiments are not limiting, but illustrative.

What is claimed is:

1. A method of operating a controller for a nonvolatile memory device, the controller including a polar code encoder and decoder circuit to encode input bits to output bits, the method comprising:
    selecting, by the polar code encoder and decoder circuit, locations of the output bits, to be punctured;
    detecting, by the polar code encoder and decoder circuit, locations of the input bits lost by puncturing based on the locations of the output bits to be punctured and a structure of a generation matrix associated with a polar code encoding;
    refreezing the input bits such that frozen bits and incapable bits overlap to generate modified input bits, the incapable bits corresponding to the locations of the lost input bits;
    performing the polar code encoding to generate the output bits based on the modified input bits;
    puncturing the output bits to generate punctured output bits based on the locations of the output bits to be punctured; and
    transmitting the punctured output bits to the nonvolatile memory device.

2. The operating method of claim 1, wherein locations of frozen bits when locations of the output bits to be punctured are selected are different from locations of the frozen bits when the bits to be punctured are not selected.

3. The operating method of claim 1, wherein locations of the incapable bits vary when the locations of the output bits to be punctured vary.

4. The operating method of claim 1, wherein the selecting the locations of the output bits to be punctured comprises:
    calculating polarization exponents of the generation matrix corresponding to different locations of the output bits; and
    selecting the locations of the output bits to be punctured having a higher polarization exponent among the different locations of the output bits.

5. The operating method of claim 1, wherein the selecting the locations of the output bits to be punctured comprises:
    dividing the generation matrix into a plurality of portions;
    calculating polarization exponents of at least one portion of the generation matrix corresponding to different locations of at least one bit of the output bits; and
    Selecting a location of the at least one bit to be punctured having a higher polarization exponent among the different locations of at least one bit of the output bits.

6. The operating method of claim 5, wherein the generation matrix is divided into at least two stages in a direction from the input bits to the output bits, each of the at least two stages is divided into a plurality of square matrices, and the at least one portion of the generation matrix corresponds to at least one square matrix of a stage adjacent to the output bits.

7. The operating method of claim 6, wherein locations of remaining portions of the generation matrix corresponding to a location of the at least one bit to be punctured are selected as locations of the bits to be punctured.

8. The operating method of claim 1, wherein locations of the output bits to be punctured are periodically distributed, and the incapable bits are concentrated in the input bits.

9. The operating method of claim 1, wherein the refreezing the input bits comprises:
    selecting the incapable bits as the frozen bits; and
    if remaining frozen bits exist after selecting of the incapable bits, calculating density evolution of the output bits and selecting locations of the remaining frozen bits to have a higher reliability according to the calculated density evolution.

10. A controller comprising:
a puncturing bit register configured to store information associated with puncturing bits;
a location providing unit configured to provide locations of the puncturing bits and frozen bits based on the stored information associated with the puncturing bits;
a frozen bit inserting unit configured to receive information word bits and to generate input word bits by inserting frozen bits into the information word bits based on the locations of the frozen bits from the location providing unit;
a generation matrix calculating unit configured to generate code word bits by calculating a generation matrix using the input word bits; and
a puncturing unit configured to generate output bits by puncturing the code word bits based on the locations of the puncturing bits from the location providing unit.

11. The controller of claim 10, wherein the output bits are transmitted to a nonvolatile memory controlled by the controller.

12. The controller of claim 10, wherein the location providing unit is further configured to calculate the locations of the puncturing bits and the frozen bits based on the stored information associated with the puncturing bits and a structure of the generation matrix.

13. The controller of claim 10, wherein the location providing unit is further configured to store a location table, and to detect locations of the puncturing bits and the frozen bits based on the information associated with the puncturing bits and the location table.

14. The controller of claim 10, further comprising:
a decoding unit configured to receive data from a nonvolatile memory controlled by the controller and to perform successive cancellation decoding, message passing decoding, or list decoding on the received data.

15. The controller of claim 10, wherein the controller forms a memory card or a solid state drive with a nonvolatile memory.

16. A method of operating a controller for a nonvolatile memory device, the controller including a polar code encoder and decoder circuit to encode input bits to output bits, the method comprising:
selecting, by the polar code encoder and decoder circuit, locations of the output bits to be punctured;
determining, by the polar code encoder and decoder circuit, an error probability associated with the input bits based on the locations of the output bits to be punctured;
identifying locations of the input bits to be replaced with static bit values based on the determined error probability;
generating modified input bits by replacing bits of the input bits corresponding to the identified locations with the static bit values;
performing polar code encoding based on the modified input bits to generate the output bits;
puncturing the output bits to generate punctured output bits; and
transmitting the punctured output bits to the nonvolatile memory device.

17. The method of claim 16, wherein the locations of the input bits are detected based on a structure of a generation matrix associated with the polar code encoding.

18. The method of claim 16, wherein the locations of the input bits are determined based on the locations of the output bits to be punctured.

19. A controller comprising:
a puncturing bit register configured to store information associated with puncturing bits;
a location providing circuit configured to identify bits of an input word to be replaced with static bit values based on an error probability associated with bits of the input word, the error probability being based on the stored information;
a frozen bit inserting circuit configured to generate a modified input word by replacing the identified bits of the input word with the static bit values;
a generation matrix calculation circuit configured to generate the puncturing bits based on the modified input word;
a puncturing circuit configured to puncture the puncturing bits to generate an output code word; and
transmitting the output code word to a nonvolatile memory device.

20. The controller of claim 19, wherein the location providing circuit is configured to determine locations of the identified bits based on a structure of the generation matrix calculation circuit.

21. The controller of claim 19, wherein the location providing circuit is configured to determine locations of the identified bits of the input word based on the information associated with the puncturing bits.

22. The controller of claim 19, further comprising:
a decoding unit configured to receive data from a nonvolatile memory controlled by the controller and to perform successive cancellation decoding, message passing decoding, or list decoding on the received data.

* * * * *

UNITED STATES PATENT AND TRADEMARK OFFICE
CERTIFICATE OF CORRECTION

PATENT NO. : 9,239,778 B2  
APPLICATION NO. : 14/054964  
DATED : January 19, 2016  
INVENTOR(S) : Dong-Min Shin et al.

Page 1 of 1

It is certified that error appears in the above-identified patent and that said Letters Patent is hereby corrected as shown below:

On the title page item 72

The correct order of inventors should read as:

Dong-Min SHIN
Kyeongcheol YANG
Seung-Chan LIM
Kijun LEE
Junjin KONG

Signed and Sealed this
Fourteenth Day of June, 2016

Michelle K. Lee
*Director of the United States Patent and Trademark Office*